US009087601B2

(12) United States Patent
Dutta et al.

(10) Patent No.: US 9,087,601 B2
(45) Date of Patent: Jul. 21, 2015

(54) SELECT GATE BIAS DURING PROGRAM OF NON-VOLATILE STORAGE

(71) Applicant: SanDisk Technologies Inc., Plano, TX (US)

(72) Inventors: Deepanshu Dutta, San Jose, CA (US); Shinji Sato, Chigasaki (JP); Fumiko Yano, Yokkaishi (JP); Chun-Hung Lai, Kamakura (JP); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 12 days.

(21) Appl. No.: 13/736,802

(22) Filed: Jan. 8, 2013

(65) Prior Publication Data
US 2014/0160848 A1    Jun. 12, 2014

Related U.S. Application Data

(60) Provisional application No. 61/734,270, filed on Dec. 6, 2012.

(51) Int. Cl.
G11C 11/34      (2006.01)
G11C 16/34      (2006.01)
G11C 16/10      (2006.01)
(Continued)

(52) U.S. Cl.
CPC ........ *G11C 16/3427* (2013.01); *G11C 11/5628* (2013.01); *G11C 16/10* (2013.01); *G11C 16/24* (2013.01); *G11C 16/0483* (2013.01); *G11C 16/12* (2013.01)

(58) Field of Classification Search
CPC . G11C 16/0483; G11C 16/3427; G11C 16/12

USPC ..................................................... 365/185.17
See application file for complete search history.

(56) References Cited

U.S. PATENT DOCUMENTS 7,023,739 B2 * 4/2006 Chen et al. ............... 365/185.28
7,623,387 B2 * 11/2009 Dong et al. ............... 365/185.18
(Continued)

OTHER PUBLICATIONS

"A 151mm2 64Gb MLC NAND Flash Memory in 24nm CMOS Technology," IEEE International Solid-State Circuits Conference, Feb. 22, 2011, Session 11, Non-Volatile Memory Solutions 11.1, pp. 198-199, 2 pages.

(Continued)

*Primary Examiner* — Anthan Tran
(74) *Attorney, Agent, or Firm* — Vierra Magen Marcus LLP

(57) ABSTRACT

Techniques disclosed herein may prevent program disturb by preventing a select transistor of an unselected NAND string from unintentionally turning on. The Vgs of a select transistor of a NAND string may be lowered from one programming pulse to the next programming pulse multiple times. The select transistor may be a drain side select transistor or a source side select transistor. Progressively lowering the Vgs of the select transistor of an unselected NAND string as programming progresses may prevent the select transistor from unintentionally turning on. Therefore, program disturb is prevented or reduced. Vgs may be lowered by applying a lower voltage to a select line associated with the select transistor. Vgs may be lowered by applying a higher voltage to bit lines associated with the unselected NAND strings as programming progresses. Vgs may be lowered by applying a higher voltage to a common source line as programming progresses.

27 Claims, 27 Drawing Sheets

(51) Int. Cl.
    *G11C 11/56*     (2006.01)
    *G11C 16/24*     (2006.01)
    *G11C 16/04*     (2006.01)
    *G11C 16/12*     (2006.01)

(56) References Cited

U.S. PATENT DOCUMENTS

| | | | |
|---|---|---|---|
| 7,691,710 | B2 | 4/2010 | Mokhlesi et al. |
| 2003/0048662 | A1* | 3/2003 | Park et al. ............... 365/185.18 |
| 2006/0291285 | A1 | 12/2006 | Mokhlesi et al. |
| 2007/0086247 | A1* | 4/2007 | Lutze et al. ............... 365/185.18 |
| 2007/0252201 | A1 | 11/2007 | Kito et al. |
| 2007/0297234 | A1 | 12/2007 | Cernea et al. |
| 2008/0205147 | A1 | 8/2008 | Santin et al. |
| 2011/0013457 | A1* | 1/2011 | Han ........................ 365/185.18 |
| 2011/0216600 | A1 | 9/2011 | Goda et al. |

OTHER PUBLICATIONS

International Search Report and Written Opinion of the International Searching Authority dated Feb. 26, 2014, PCT Patent Application No. PCT/US2013/070841, filed Nov. 19, 2013, 9 pages.

* cited by examiner

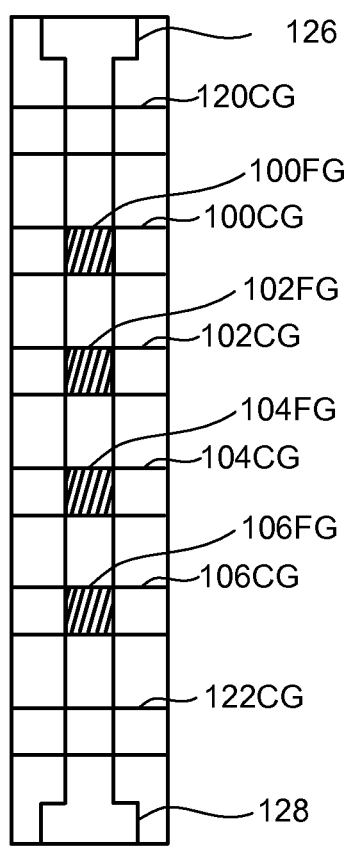
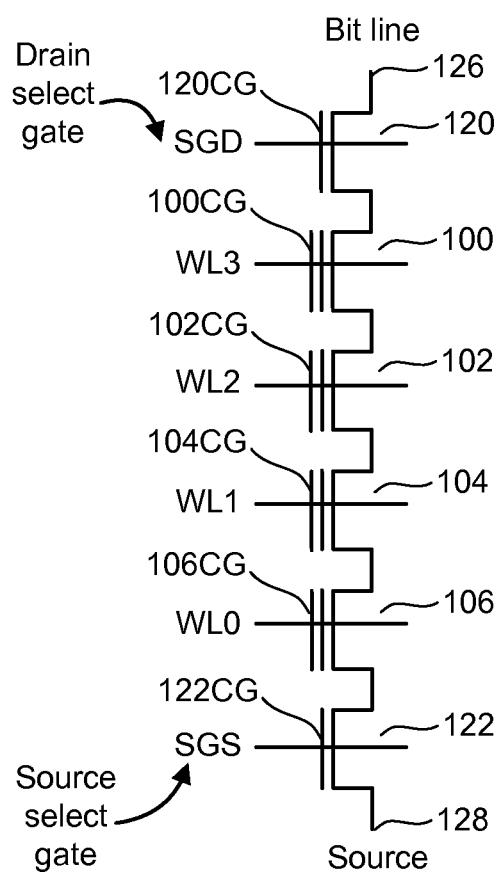
Fig. 1A
Fig. 1B

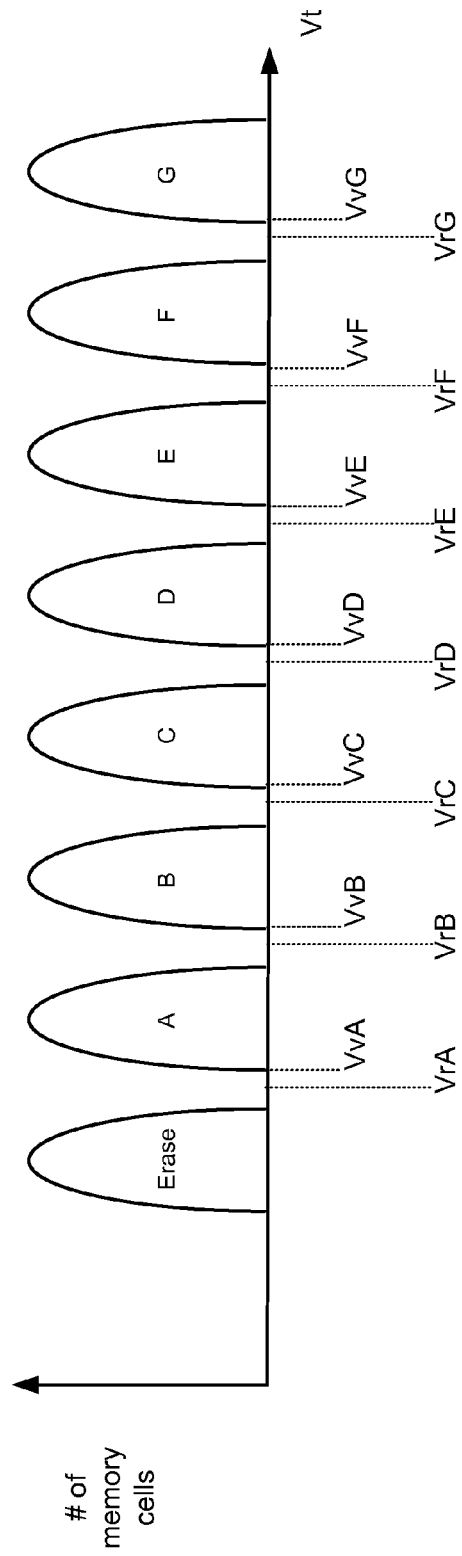
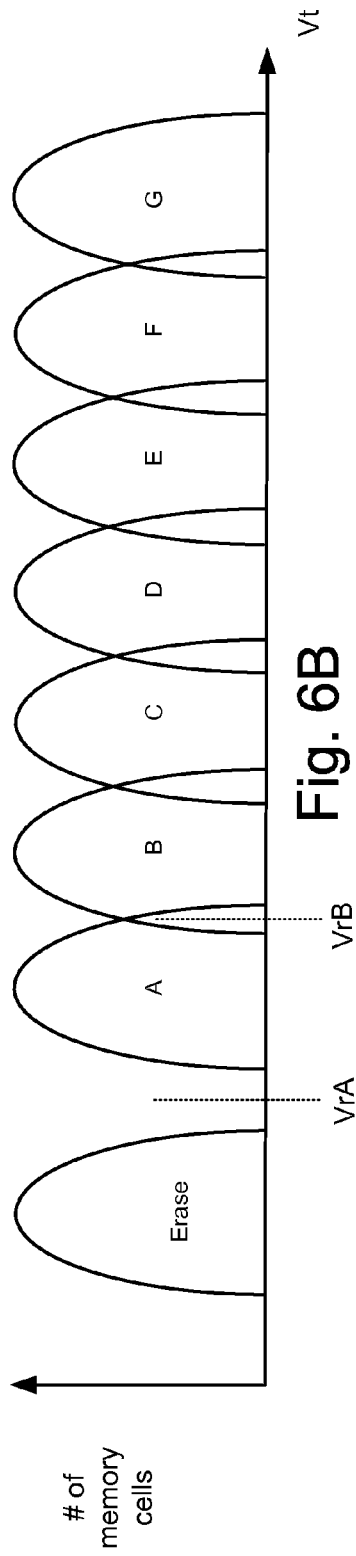
Fig. 6A
Fig. 6B

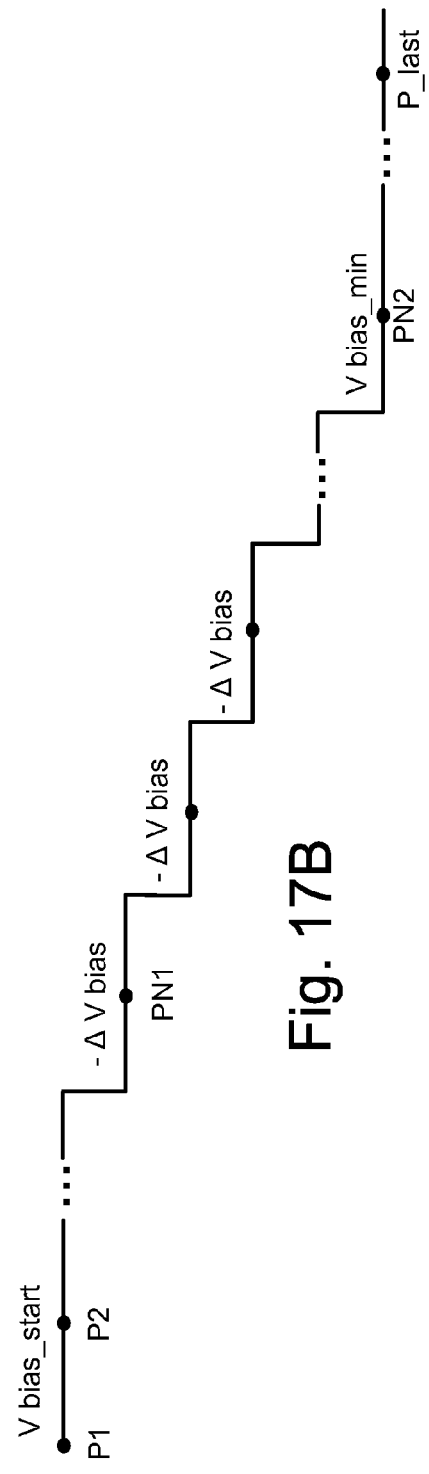
Fig. 16B
Fig. 17B

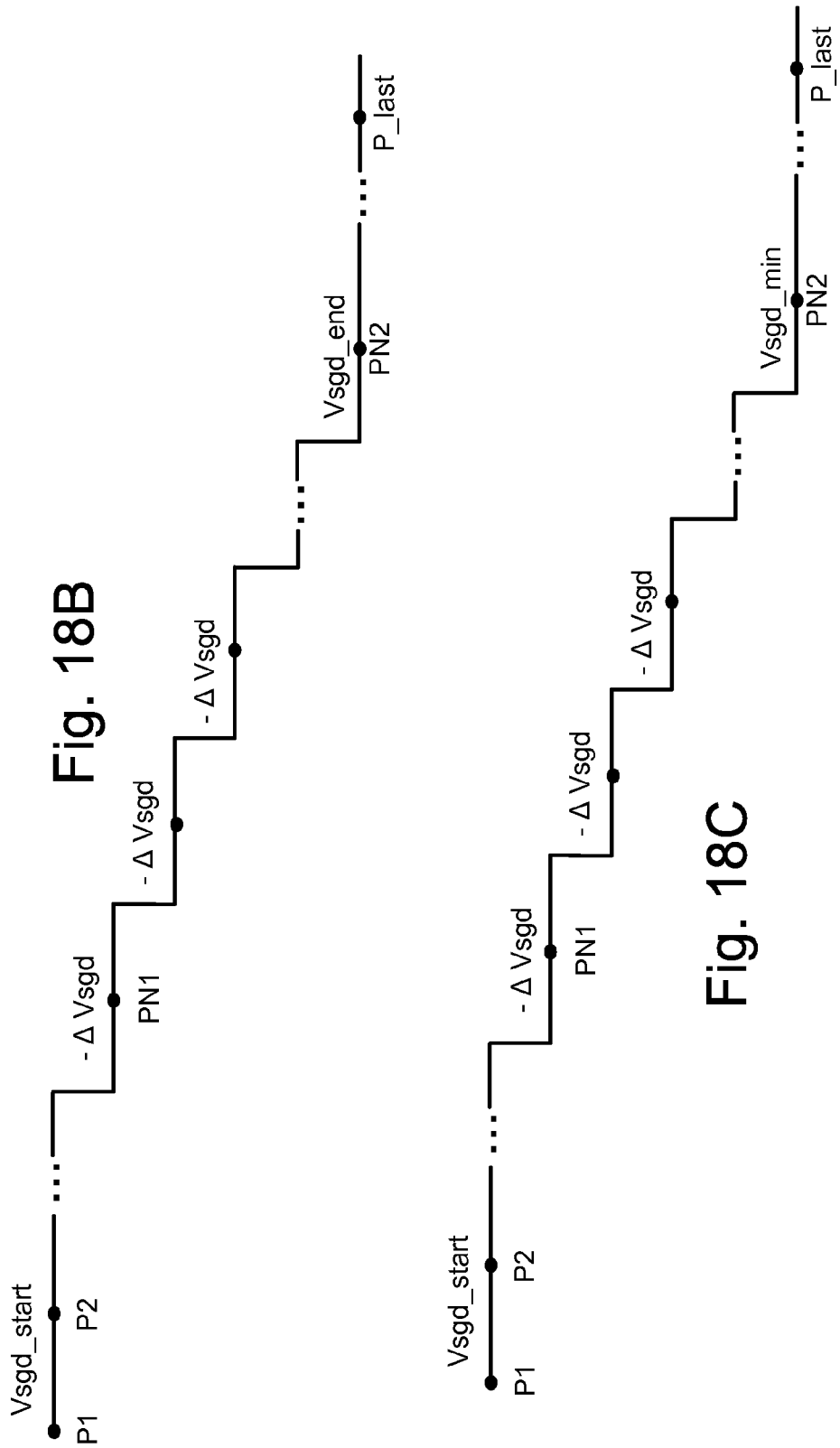

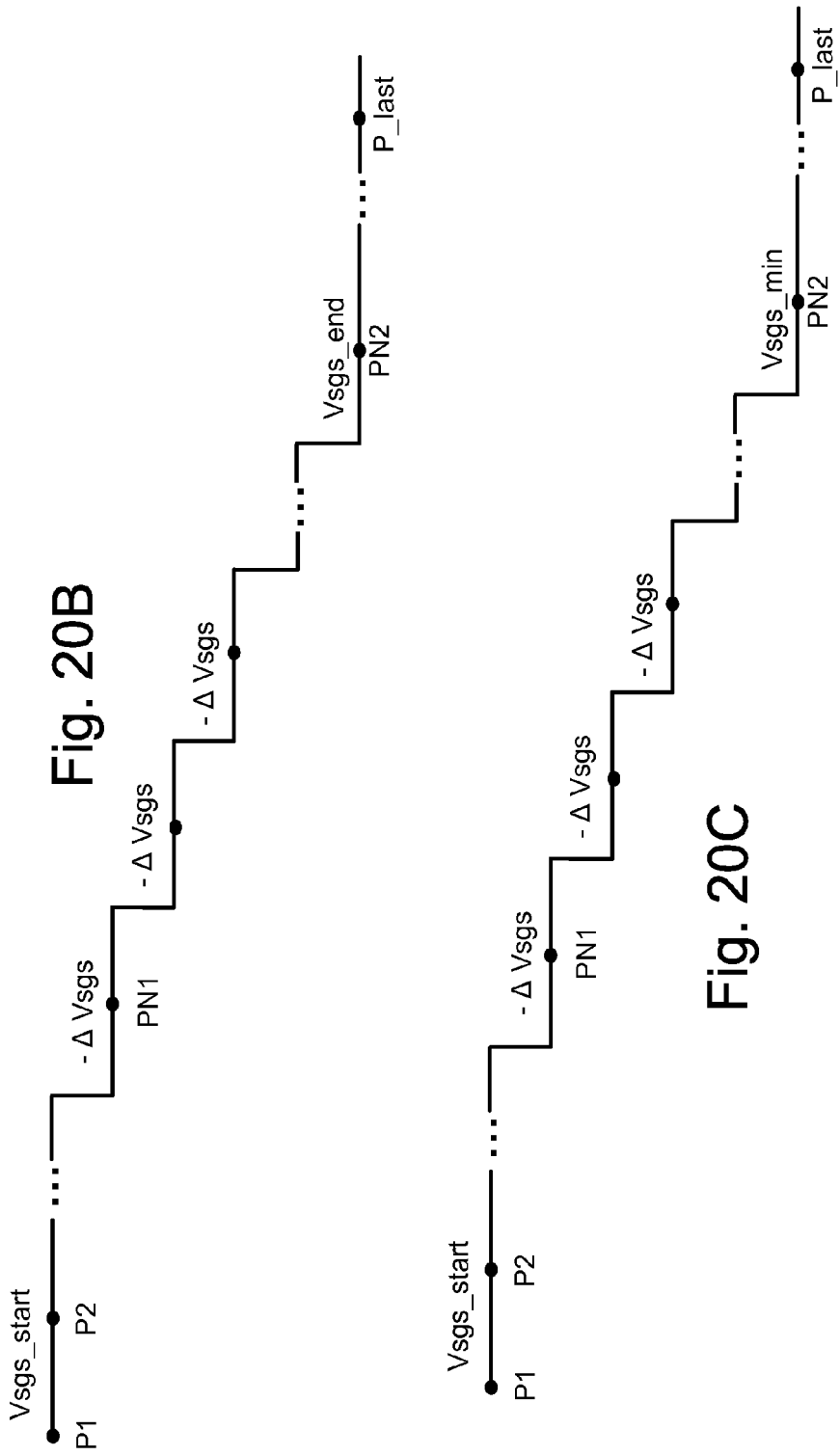

SELECT GATE BIAS DURING PROGRAM OF NON-VOLATILE STORAGE

CLAIM OF PRIORITY

This application claims the benefit of U.S. Provisional Application No. 61/734,270 entitled, "Select Gate Bias During Program of Non-Volatile Storage," filed on Dec. 6, 2012, which is incorporated herein by reference.

BACKGROUND

The present disclosure relates to non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the drain and source diffusion regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its drain and source is controlled by the level of charge on the floating gate.

In a NAND architecture, memory cells are arranged as NAND strings. A NAND string includes memory cells (each including a floating gate) connected in series over a substrate. At each end of the NAND string there is a select transistor (also referred to as a select gate). One of the select transistors (source side select transistor) connects/disconnects the NAND string to a source line that is common to a large group of NAND strings. Each NAND string is associated with one bit line. The other select transistor (drain side select transistor) connects/disconnects its NAND string to a bit line. In one approach, a memory cell on a NAND string may be read by applying a voltage to its control gate and sensing a signal on the bit line.

Typically, a program voltage $V_{PGM}$ applied to the control gate during a program operation is applied as a series of pulses that increase in magnitude as programming progresses. In one possible approach, the magnitude of the pulses is increased with each successive pulse by a predetermined step size, e.g., 0.2-0.4 V. $V_{PGM}$ can be applied to the control gates of flash memory cells. In the periods between the program pulses, verify operations are carried out. That is, the programming level of each element of a group of cells being programmed in parallel is read between successive programming pulses to determine whether it is equal to or greater than a verify level to which the element is being programmed.

After a given memory cell on the word line selected for programming reaches its intended threshold voltage, programming may be inhibited for that memory cell. In one approach, programming is inhibited by applying an inhibit voltage to the bit line associated with unselected NAND strings. The voltage applied to the gate of the drain side select transistor should be low enough to keep the transistor off, such that the channel of an unselected NAND string may float. Likewise, the voltage applied to the gate of the source side select transistor should be low enough to keep the transistor off, such that the channel of an unselected NAND string may float. Also, a voltage is applied to control gates of unselected memory cells, which boosts the voltage in the channel region of the memory cells on inhibited NAND strings. This boosted channel voltage helps to reduce or eliminate program disturb.

However, if a select transistor of an unselected NAND string undesirably turns on, then the channel voltage of the unselected NAND string will not properly boost. If the channel voltage does not properly boost, this can result in program disturb.

BRIEF DESCRIPTION OF THE DRAWINGS

FIG. 1A is a top view of a NAND string.

FIG. 1B is an equivalent circuit diagram of the NAND string of FIG. 1A.

FIG. 6A depicts an example set of Vt distributions.

FIG. 6B depicts an example set of Vt distributions.

FIG. 16B depicts one embodiment of Vgs biases for select transistors.

FIG. 17B depicts one embodiment of Vgs biases.

FIGS. 18B and 18C are two example sequences of Vsgd that may be applied during the process of FIG. 18A.

FIG. 20B and FIG. 20C are two example sequences of Vsgs that may be applied during the process of FIG. 20A.

DETAILED DESCRIPTION

Figure 2:
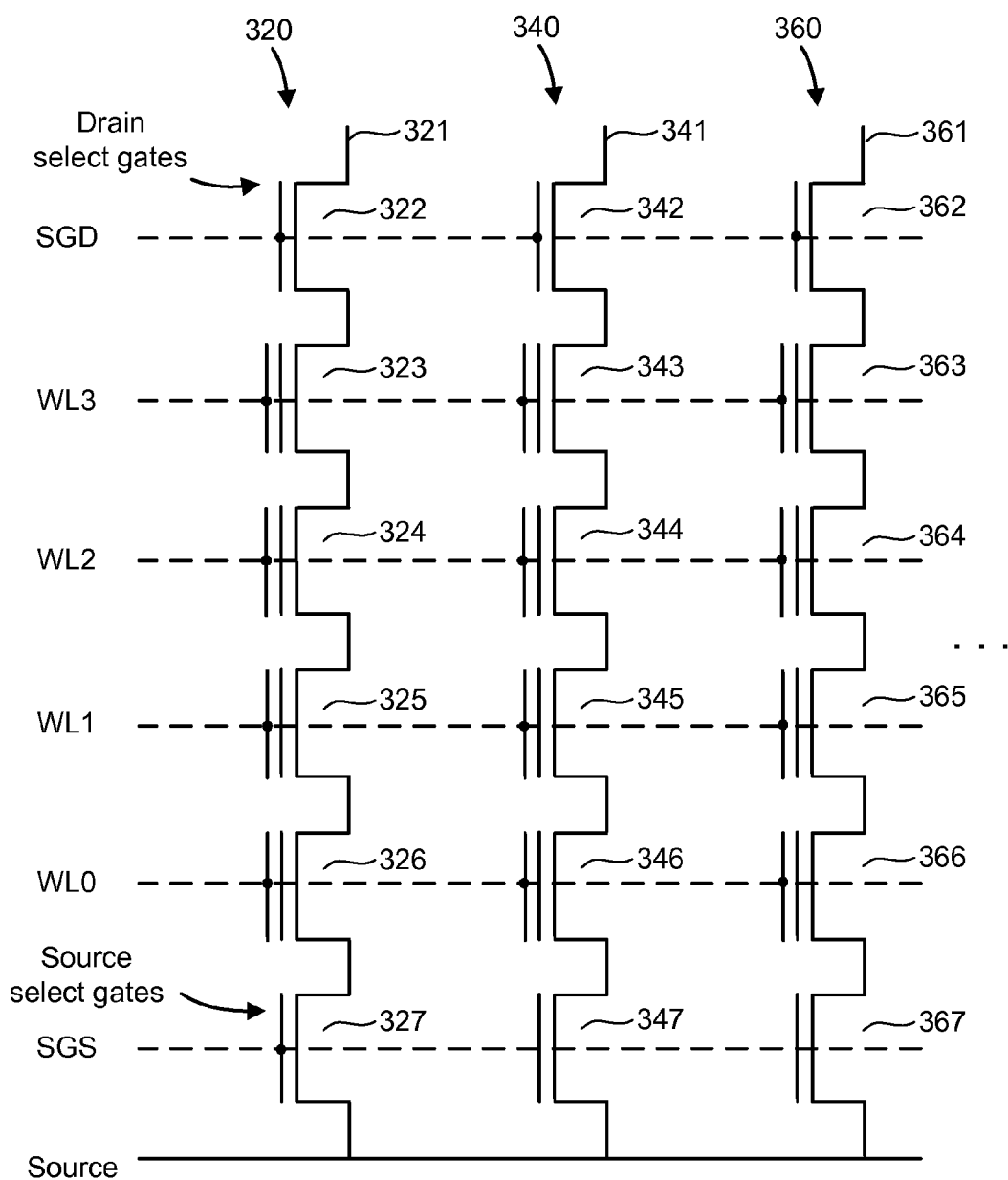
FIG. 2 is a circuit diagram depicting three NAND strings.

The present disclosure provides methods and devices for operating non-volatile storage. Techniques disclosed herein may prevent or reduce program disturb. Techniques disclosed herein may prevent or reduce program disturb by preventing a select transistor of an unselected NAND string from unintentionally turning on during programming of memory cells on other NAND strings.

In one embodiment, the gate to source voltage (Vgs) applied to a select transistor of a NAND string is progressively lowered as programming progresses. For example, Vgs may be lowered from one programming pulse to the next programming pulse. Vgs may be the same for the first few programming pulses, then be progressively lowered for the next few programming pulses, then be held constant for the last few programming pulses, as one example. Note that Vgs may be lowered a number of times during the programming operation. The select transistor may be a drain side select transistor or a source side select transistor.

Progressively lowering Vgs of the select transistor of the unselected NAND string as programming progresses may help to prevent the select transistor from unintentionally turning on. This may help to keep the channel of the unselected NAND string properly boosted such that programming is inhibited. Therefore, program disturb is prevented or reduced.

In one embodiment, Vgs is lowered by applying a different voltage to a select line associated with (e.g., coupled to) a gate of the select transistor from one programming voltage to the next. In one embodiment, Vgs is lowered by applying a higher voltage to bit lines associated with (e.g., coupled to) the unselected NAND strings as programming progresses. In one embodiment, Vgs is lowered by increasing the voltage applied to a common source line that is associated with (e.g., coupled to) a source side select transistor as programming progresses.

In one embodiment, the magnitude of the inhibit voltage that is applied to a bit line associated with an unselected NAND string depends on the programming status of its adjacent (e.g., neighbor) NAND adjacent. In one embodiment, a higher inhibit voltage is applied if one but not both adjacent NAND strings are programming. The voltage may be higher relative to a voltage used if both adjacent NAND strings are programming. A still higher inhibit voltage may be applied if both adjacent NAND strings are programming.

One example of a memory system suitable for implementing embodiments uses a NAND flash memory structure, which includes arranging multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1A and 1B. Select gate 120 is connected to select line SGD. Select gate 122 is connected to select line SGS. In one embodiment, select gates 120 and 122 are each implemented with a "select transistor." Thus, select gate 120 may be referred to as a "drain side select transistor," (or SGD transistor) and select gate 122 may be referred to as a "source side select transistor" (or SGS transistor).

FIG. 2 is a circuit diagram depicting three NAND strings. A typical architecture for a flash memory system using a NAND structure may include many NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have thirty-two, sixty-four, or more storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. In one embodiment, the various NAND strings 320, 340 and 360 are connected to respective bit lines 321, 341 and 361, by select transistors. In one embodiment, the select transistors are in the select gates 322, 342, 362, etc. In one embodiment, the select transistors form the select gates 322, 342, 362. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422; 5,570,315; 5,774,397; 6,046,935; 6,456,528; and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

Figure 3:
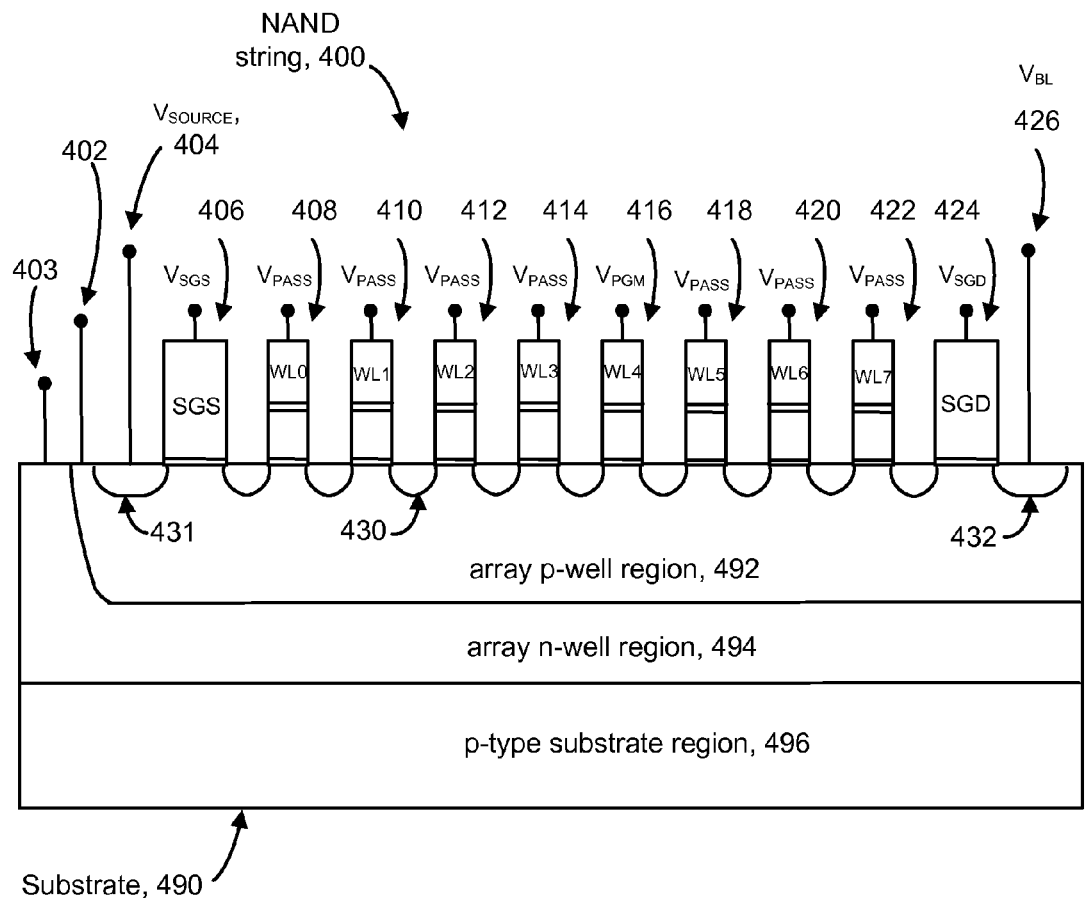
FIG. 3 depicts a cross-sectional view of a NAND string formed on a substrate.

FIG. 3 depicts a cross-sectional view of a NAND string formed on a substrate. The view is simplified and not to scale. The NAND string 400 includes a source-side select gate (or SGS transistor) 406, a drain-side select gate (or SGD transistor) 424, and eight storage elements 408, 410, 412, 414, 416, 418, 420 and 422, formed on a substrate 490. A number of source/drain regions, one example of which is source drain/region 430, are provided on either side of each storage element. In one embodiment, the substrate 490 employs a triple-well technology which includes an array p-well region 492 within an array n-well region 494, which in turn is within a p-type substrate region 496. The NAND string and its non-volatile storage elements can be formed, at least in part, on the array p-well region 492.

A voltage $V_{SOURCE}$ is provided to a source line contact 404. The source line contact has an electrical connection to the diffusion region 431 of SGS transistor 406. A bit line voltage $V_{BL}$ is supplied to bit line contact 426, which is in electrical contact with the diffusion region 432 of SGD transistor 424. Voltages, such as body bias voltages, can also be applied to the array p-well region 492 via a terminal 402 and/or to the array n-well region 494 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. $V_{SGS}$ and $V_{SGD}$ are applied to the select gates 406 and 424, respectively.

Figure 4:
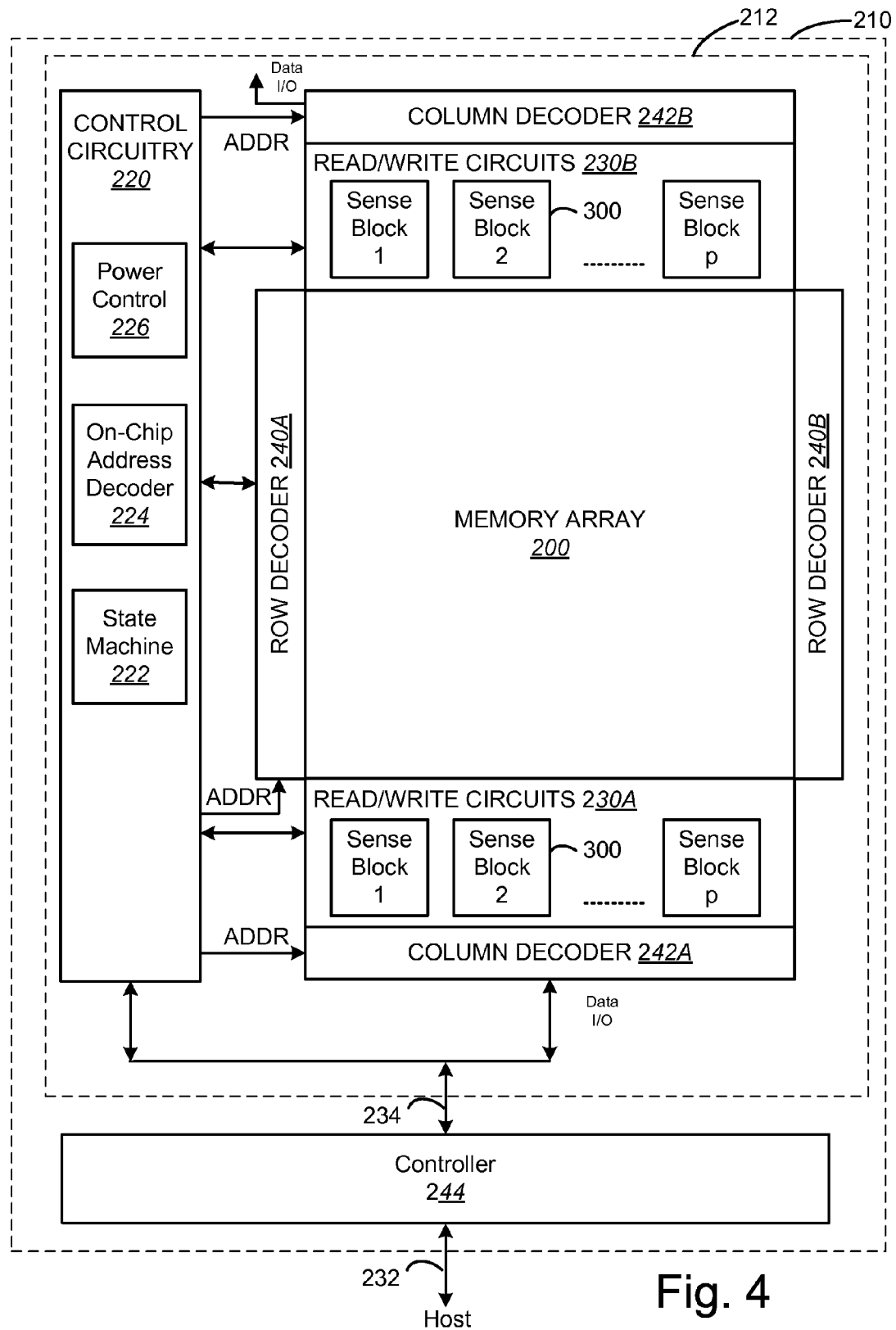
FIG. 4 illustrates a non-volatile storage device.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5A:
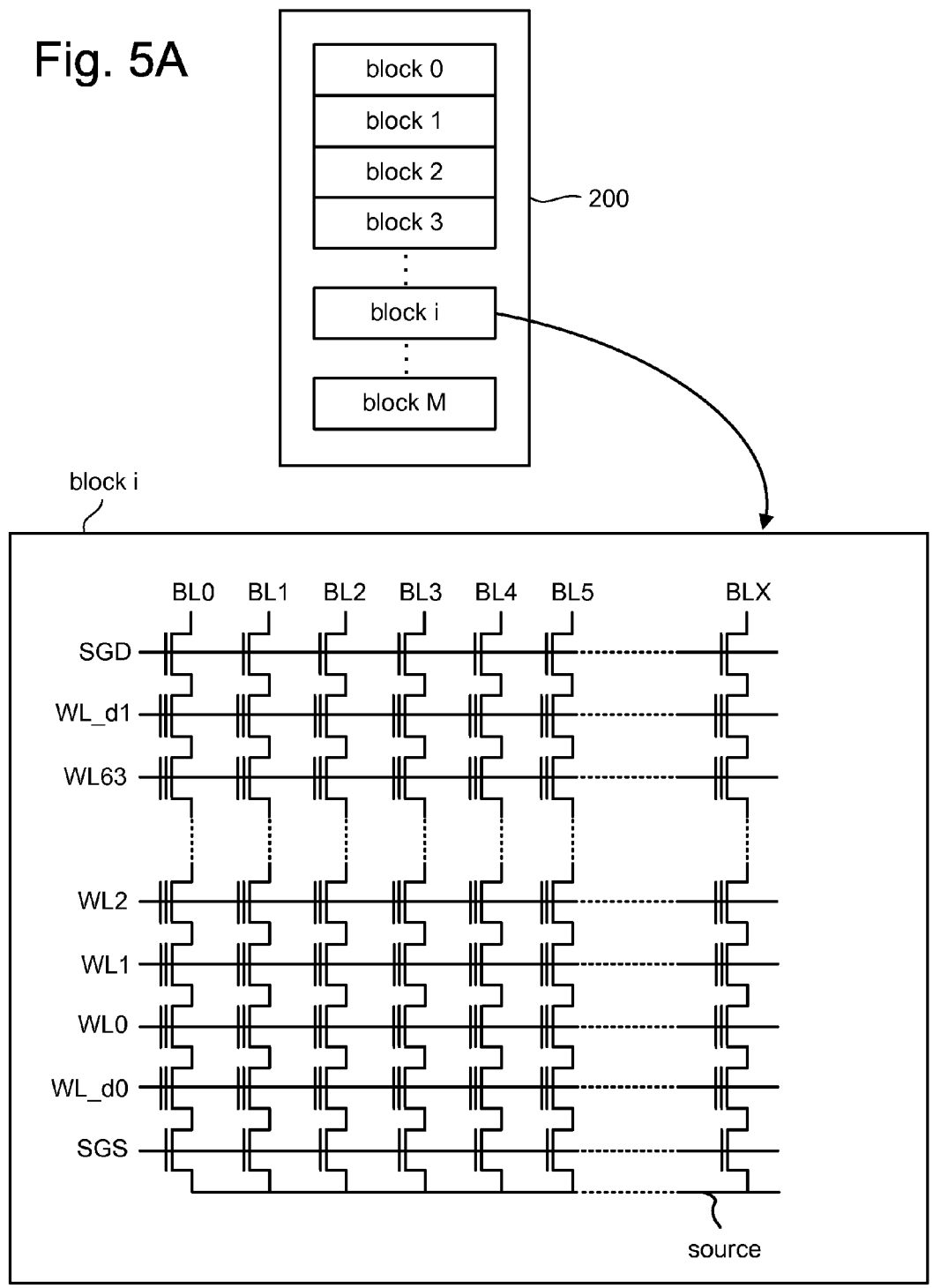
FIG. 5A depicts an exemplary structure of memory cell array.

FIG. 5A depicts an example structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. In one embodiment, the controller 244 is able to correct a certain number of misreads, based on the ECC.

Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5A shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

Figure 5B:
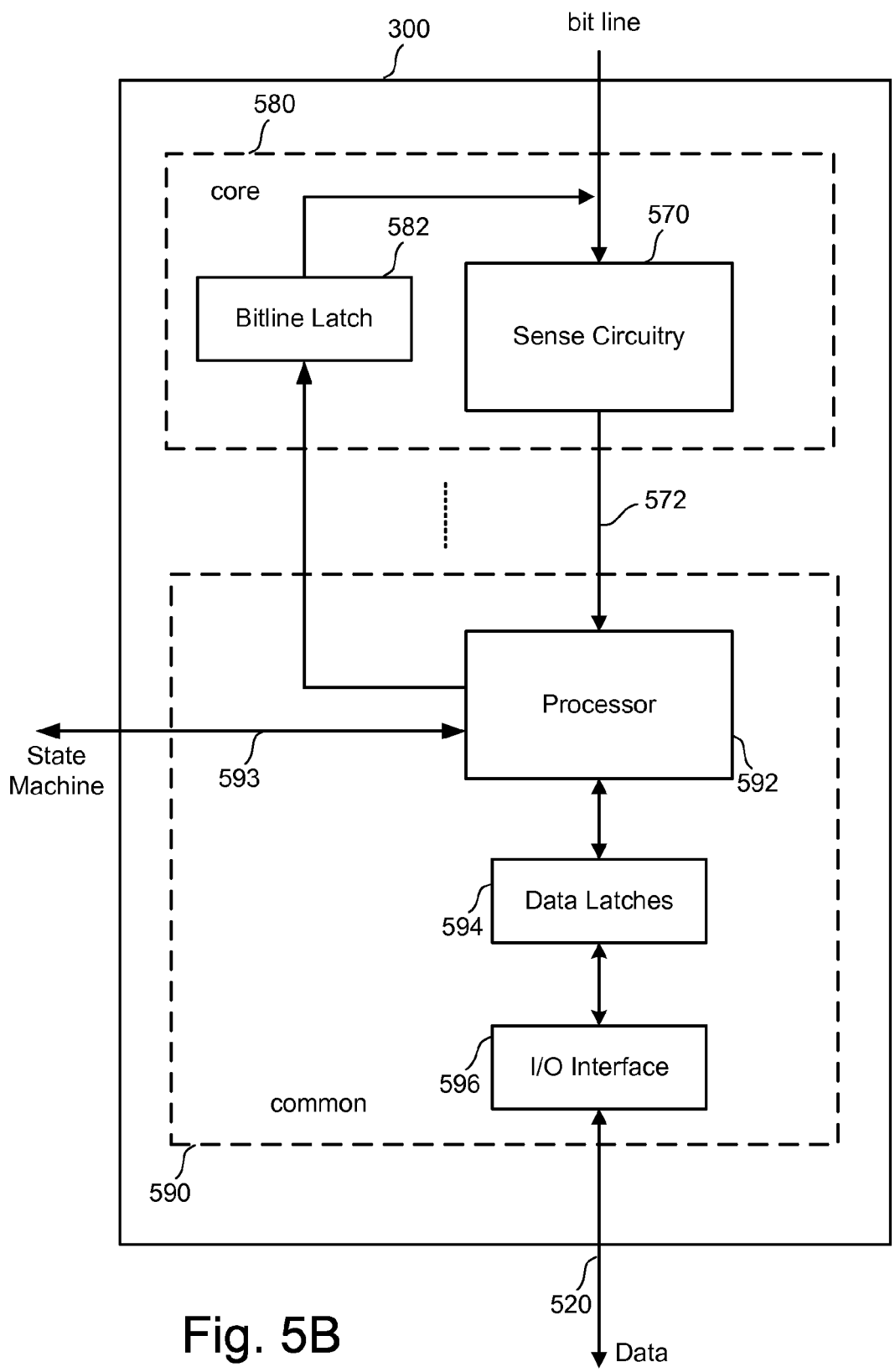
FIG. 5B is a block diagram of an individual sense block.

FIG. 5B is a block diagram of an individual sense block 300 partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572. For further details, refer to U.S. Patent Application Publication 2006/0140007, which is incorporated herein by reference in its entirety.

Sense module 580 comprises sense circuitry 570 that determines whether a conduction current in a connected bit line is above or below a predetermined threshold level. In some embodiments, sense module 580 includes a circuit commonly referred to as a sense amplifier. Sense module 580 also includes a bit line latch 582 that is used to set a voltage condition on the connected bit line. For example, a predetermined state latched in bit line latch 582 will result in the connected bit line being pulled to a state designating program inhibit (e.g., $V_{DD}$).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed memory cell and store the determined data in the set of data latches. The set of data latches 594 is used to store data bits determined by processor 592 during a read operation. Data latches 594 may also be used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 222 that controls the supply of different control gate voltages to the addressed cell. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

It is anticipated that some implementations will include multiple processors 592. In one embodiment, each processor 592 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 592 to accumulate the results of the associated bit lines such that the state machine need only read the wired-OR line one time.

During program or verify, the data to be programmed is stored in the set of data latches 594 from the data bus 520. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 592 monitors the verified memory state relative to the desired memory state. When the two are in agreement, processor 592 sets the bit line latch 582 so as to cause the bit line to be pulled to a state designating program inhibit. This inhibits the cell associated with the bit line from further programming even if it is subjected to programming pulses on its control gate. In other embodiments the processor initially loads the bit line latch 582 and the sense circuitry sets it to an inhibit value during the verify process. In one embodiment, the magnitude of the inhibit value depends on the location of the selected word line.

Data latch stack 594 contains a stack of data latches corresponding to the sense module. In one embodiment, there are 3-5 (or another number) data latches per sense module 580. In one embodiment, the latches are each one bit. In some implementations (but not required), the data latches are implemented as a shift register so that the parallel data stored therein is converted to serial data for data bus 520, and vice versa. In one embodiment, all the data latches corresponding to the read/write block of M memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Pat. No. 7,046,568, "Memory Sensing Circuit and Method for Low Voltage Operation; (4) U.S. Pat. No. 7,196,928, "Compensating for Coupling During Read Operations of Non-Volatile Memory," and (5) U.S. Pat. No. 7,327,619, "Reference Sense Amplifier For Non-Volatile Memory". All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores three bits of data. Other embodiment, however, may use more or fewer than three bits of data per memory cell. FIG. 6A shows eight Vt distributions corresponding to an Erase state and programmed states A-G. In one embodiment, the threshold voltages in the Erase state are negative and the threshold voltages in the programmed states A-G are positive.

However, the threshold voltages in one or more of programmed states A-G may be negative. Thus, in one embodiment, at least VrA is negative. Other voltages such as VvA, VrB, VvB, etc., may also be negative.

Between each of the data states are read reference voltages used for reading data from memory cells. For example, FIG. 6A shows read reference voltage VrA between the erase state and the A-state, and VrB between the A-state and B-state. By testing whether the threshold voltage of a given memory cell is above or below the respective read reference voltages, the system can determine what state the memory cell is in.

At or near the lower edge of each programmed state are verify reference voltages. For example, FIG. 6A shows VvA for the A-state and VvB for the B-state. When programming memory cells to a given state, the system will test whether those memory cells have a threshold voltage greater than or equal to the verify reference voltage.

FIG. 6B illustrates that Vt distributions can partially overlap since the error correction algorithm can handle a certain percentage of cells that are in error. Note that in some embodiments, at one point in time the threshold voltage distribution may resemble FIG. 6A and at another time the threshold voltage distributions may overlap, as in FIG. 6B. For example, just after programming, the threshold voltage distribution may resemble FIG. 6A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figure 7A:
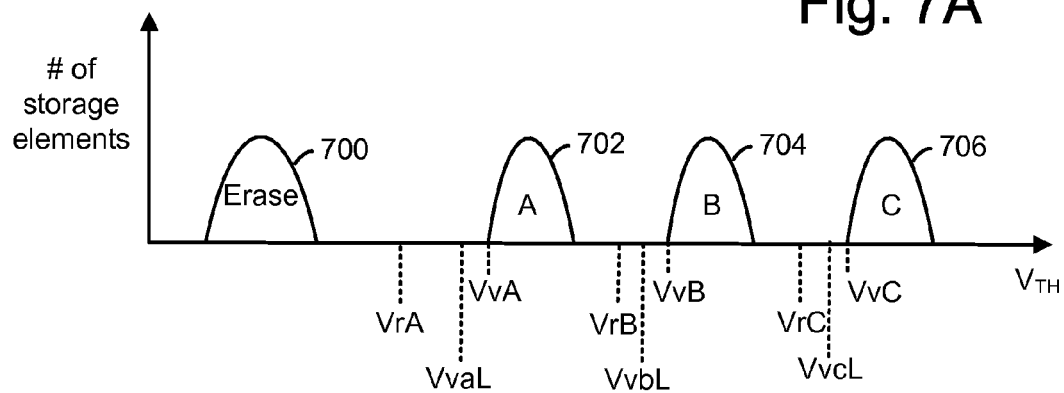
FIG. 7A depicts an example set of threshold voltage distributions for a four-state memory device in which each storage element stores two bits of data.

In some embodiments, a "verify low" and a "verify high" reference voltage is used. FIG. 7A depicts an example set of threshold voltage distributions for a four-state memory device in which each storage element stores two bits of data. A first threshold voltage distribution 700 is provided for erased (Erased-state) storage elements. Three threshold voltage distributions 702, 704 and 706 represent programmed states A, B and C, respectively. In one embodiment, the threshold voltages in the Erased-state are negative, and the threshold voltages in the A-, B- and C-states are positive.

Read reference voltages, VrA, VrB and VrC, are also provided for reading data from storage elements. By testing whether the threshold voltage of a given storage element is above or below VrA, VrB and VrC, the system can determine the state, e.g., the storage element is in.

Further, verify reference voltages, VvA, VvB, and VvC are provided. When programming storage elements to the A-state, B-state or C-state, the system will test whether those storage elements have a threshold voltage greater than or equal to VvA, VvB or VvC, respectively. In one embodiment, "verify low" reference voltages, VvaL, VvbL, and VvcL are provided. Similar "verify low" reference voltages could also be used in embodiments with a different number of states.

Figure 7B:
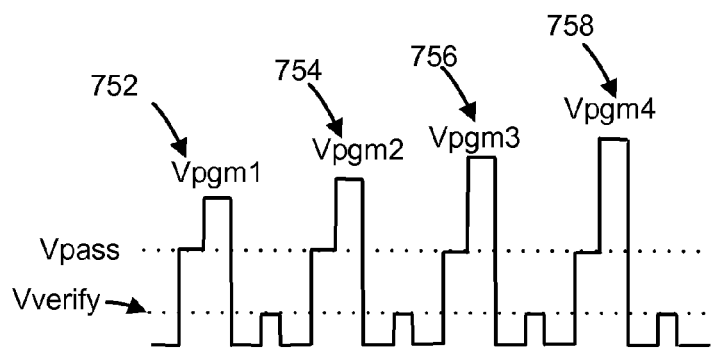
FIG. 7B shows a series of program pulses that may be used to program a distribution of FIG. 7A.

In full sequence programming, storage elements can be programmed from the Erased-state directly to any of the programmed states A, B or C. For example, a population of storage elements to be programmed may first be erased so that all storage elements in the population are in the Erased-state. A series of program pulses such as depicted in FIG. 7B is used to program storage elements directly into the A-, B- and C-states. While some storage elements are being programmed from the Erased-state to the A-state, other storage elements are being programmed from the Erased-state to the B-state and/or from the Erased-state to the C-state. Note that using a full sequence programming is not required.

One example of a slow programming mode uses low (offset) and high (target) verify levels for one or more data states. For example, VvaL and VvA are offset and target verify levels, respectively, for the A-state, and VvbL and VvB are offset and target verify levels, respectively, for the B-state. During programming, when the threshold voltage of a storage element which is being programmed to the A-state as a target state (e.g., an A-state storage element) exceeds VvaL, its programming speed is slowed, such as by raising the bit line voltage to a level, e.g., 0.6-0.9 V, which is between a nominal program or non-inhibit level, e.g., 0 V and a full inhibit level, e.g., 2-3 V. The middle value may be referred to as a quick pass write (QPW) value. This provides greater accuracy by avoiding large step increases in threshold voltage.

When the threshold voltage reaches VvA, the storage element is locked out from further programming. Similarly, when the threshold voltage of a B-state storage element exceeds VvbL, its programming speed is slowed, and when the threshold voltage reaches VvB, the storage element is locked out from further programming. In one approach, a slow programming mode is not used for the highest state since some overshoot is typically acceptable. Instead, the slow programming mode can be used for the programmed states, above the erased state, and below the highest state.

Moreover, in the example programming techniques discussed, the threshold voltage of a storage element is raised as it is programmed to a target data state. However, programming techniques can be used in which the threshold voltage of a storage element is lowered as it is programmed to a target data state. Programming techniques which measure storage element current can be used as well. The concepts herein can be adapted to different programming techniques.

FIG. 7B depicts a series of program and verify pulses which are applied to a selected word line during a programming operation. A programming operation may include multiple programming iterations, where each iteration applies one or more program pulses (voltages) followed by one or more verify voltages, to a selected word line. In one possible approach, the program voltages are stepped up in successive iterations. Moreover, the program voltages may include a first portion which has a pass voltage (Vpass) level, e.g., 6-8 V, followed by a second portion at a program level, e.g., 12-25 V. For example, first, second, third and fourth program pulses 752, 754, 756 and 758 have program voltages of Vpgm1, Vpgm2, Vpgm3 and Vpgm4, respectively, and so forth. A set of one or more verify voltages may be provided after each program pulse. In some embodiments, there may be two or more verify pulses between the program pulses. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

Figure 8:
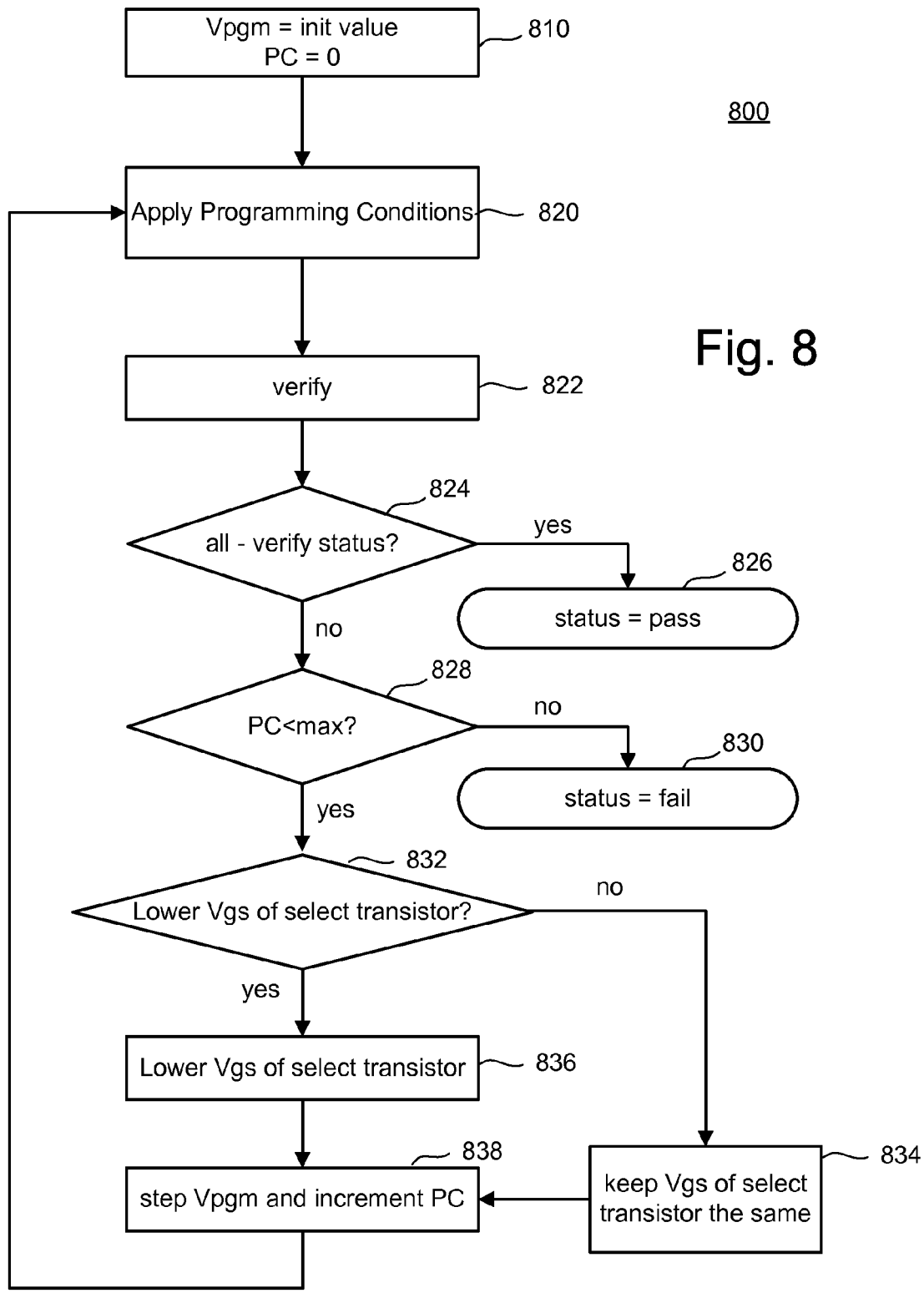
FIG. 8 is a flowchart describing one embodiment of a programming process.

FIG. 8 is a flowchart describing one embodiment of a programming process 800, which includes one or more verification steps. In one embodiment, the process is used to program memory cells on a selected word line. In one embodiment, the process is used to program every memory cell on the selected word line. In one embodiment, the process is used to program every other memory cell (e.g., odd/even programming) on the selected word line.

In step 810, the program voltage (Vpgm) is set to an initial value. Also, in step 810, a program counter (PC) is initialized to zero.

Figure 9:
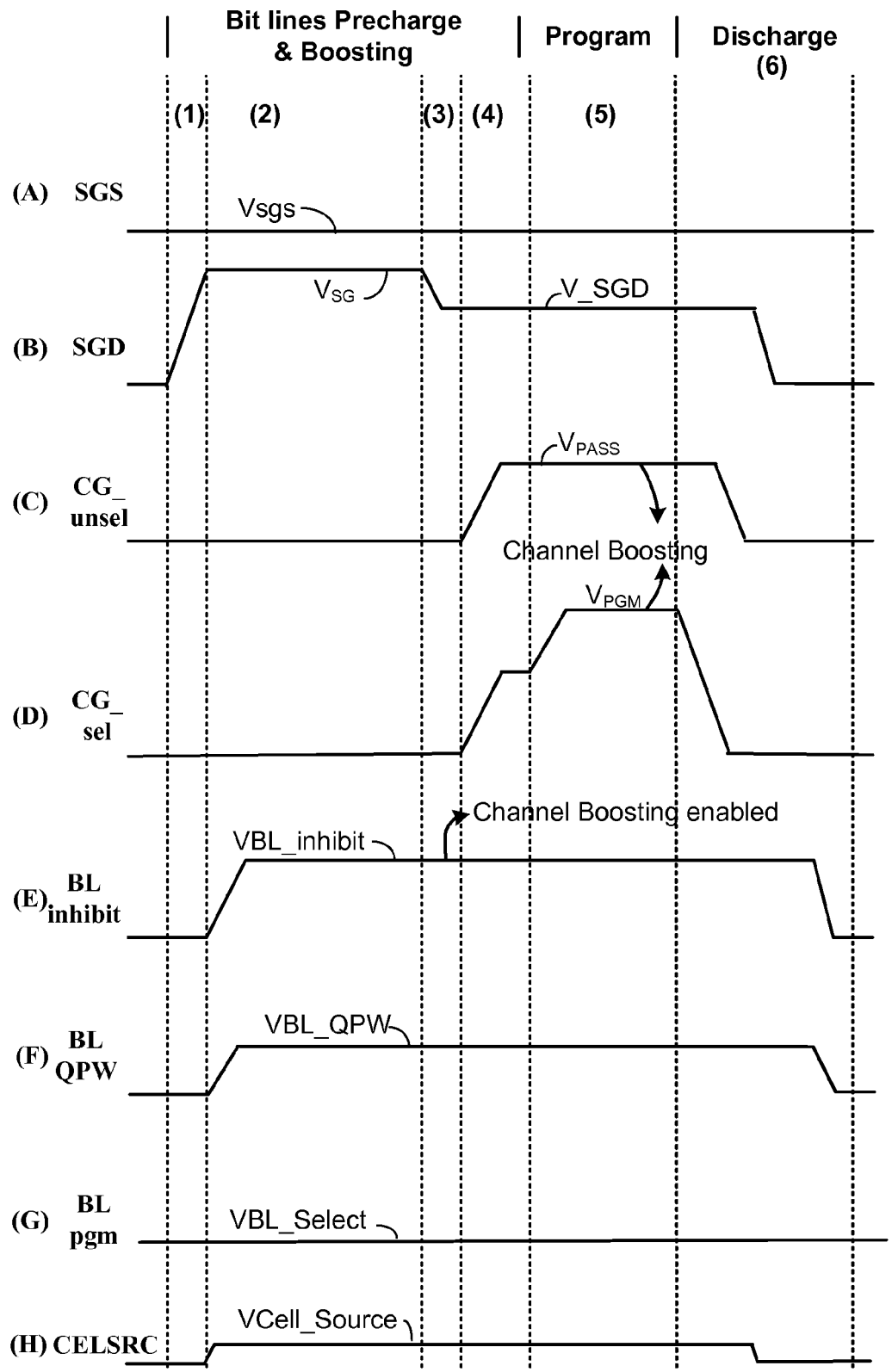
FIGS. 9(A)-9(H) are timing diagrams illustrating voltages during program operations, according to one embodiment.

In step 820, programming conditions are applied. Applying the programming conditions may include applying Vgs to a select transistor of a NAND string. In one embodiment, the Vgs applied to a select transistor is progressively lowered during programming. For example, the magnitude is lowered relative to the last time step 820 was performed. FIG. 9, to be discussed below, shows some examples of programming conditions that may be applied during step 820.

Applying the programming conditions includes applying a programming signal (e.g., voltage pulse) to a selected word line. Step 820 may also include applying an appropriate voltage to bit lines. In one embodiment, a first voltage (e.g., a low voltage) is applied to bit lines associated with NAND strings having a memory cell presently undergoing normal (or fast) programming, a second voltage (e.g., a medium voltage) is applied to bit lines associated with NAND strings having a memory cell presently undergoing slow programming, and a third voltage (e.g., a high voltage) is applied to bit lines associated with NAND strings having a memory cell presently inhibited from or locked out from further programming. In one embodiment, the magnitude of the voltage applied to inhibit a NAND string is progressively increased during programming. For example the inhibit voltage may be raised from one iteration of step 820 to the next.

Figure 19A:
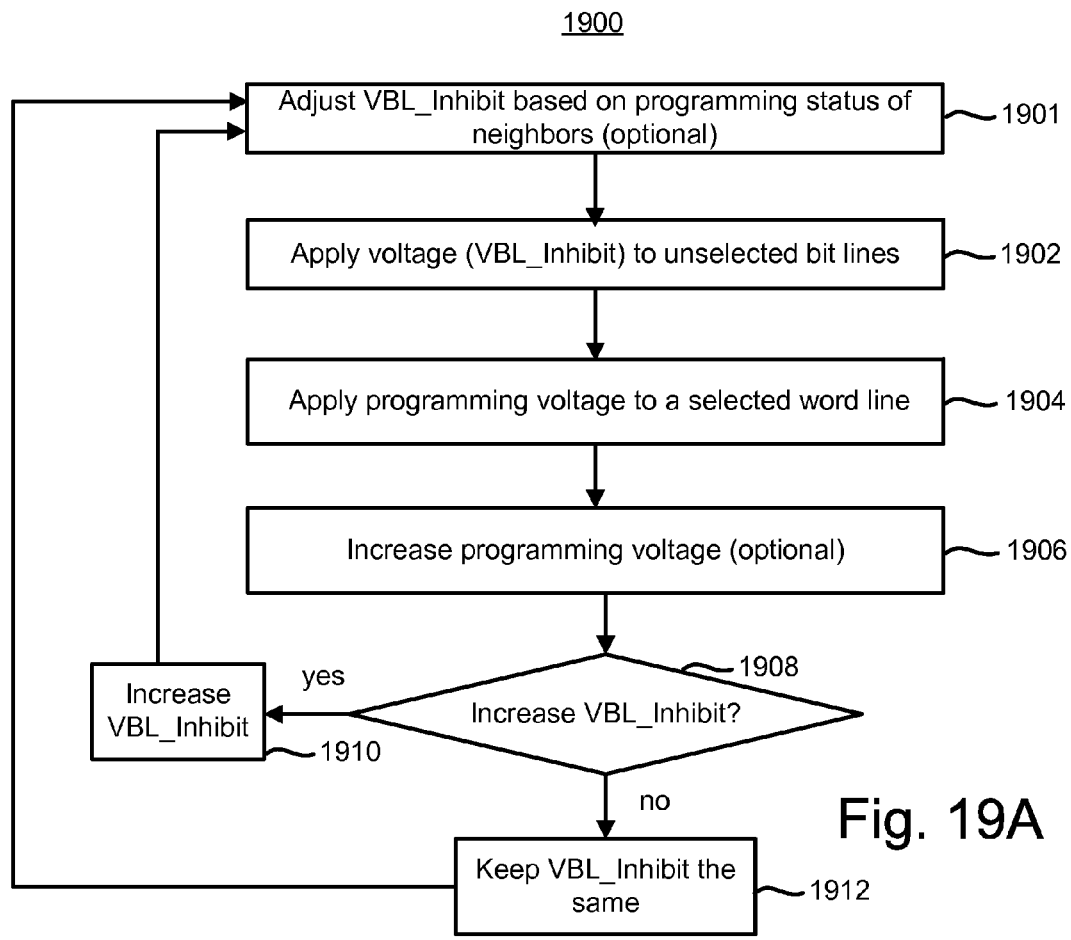
FIG. 19A is a flowchart of one embodiment of a process of increasing the BL inhibit voltage as programming progresses.
Figure 19B:
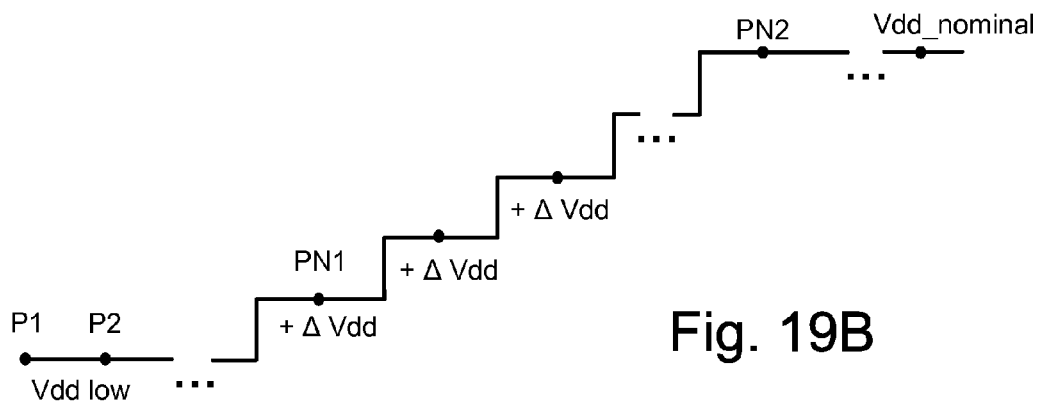
FIG. 19B is an example sequence of VBL_inhibit that may be applied during the process of FIG. 19A.
Figure 19C:
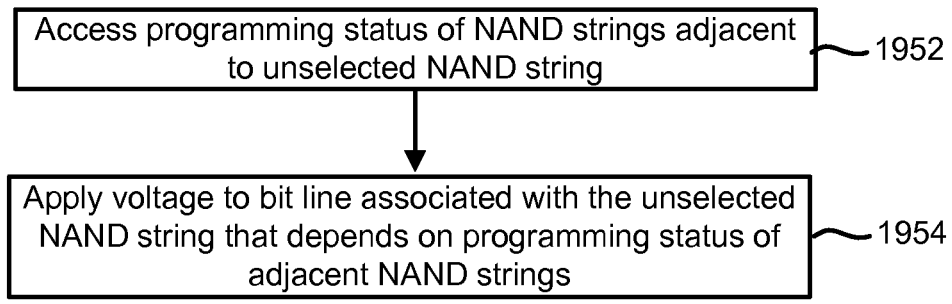
FIG. 19C is a flowchart of one embodiment of a process of applying a voltage to a bit line associated with an unselected bit line that depends on the programming status of the adjacent NAND strings.
Figure 19D:
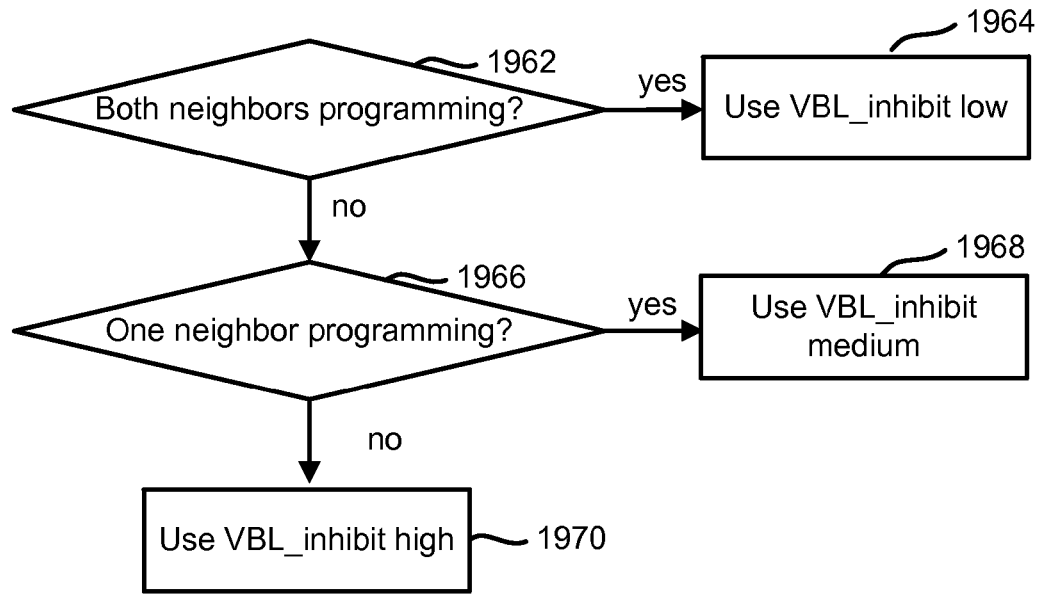
FIG. 19D shows details of one embodiment of a process of determining a BL inhibit voltage based on a neighbor's programming status.

In one embodiment, step 820 includes applying an inhibit voltage to an unselected bit line that depends on the programming status of neighbor NAND strings. FIG. 19C, to be discussed below, describes one embodiments of applying an inhibit voltage to an unselected bit line that depends on the programming status of neighbor NAND strings. FIG. 19D, to be discussed below, describes one embodiments of determining a magnitude for an inhibit voltage that depends on the programming status of neighbor NAND strings.

Step 820 may also include applying an appropriate voltage to a common source line. In one embodiment, the magnitude of the voltage to a common source line is progressively increased during programming. For example the voltage may be raised from one iteration of step 820 to the next.

Step 820 may also include applying an appropriate voltage to a gate of a select transistor of a NAND string. Stated another way, step 820 may include applying an appropriate voltage to select line of a NAND string. The select transistor may be for either an SGS gate 406 or an SGD gate 424. Thus, the select line may be either a source side select line (e.g., SGS) or a drain side select line (e.g., SGD). In one embodiment, the magnitude of the voltage to the select line of a select transistor of a NAND string is progressively decreased during programming. For example the voltage may be lowered from one iteration of step 820 to the next.

Applying the program conditions in step 820 may also include applying a pass voltage to unselected word lines. The magnitude of the pass voltage for each unselected word line may depend on which boosting scheme is being used. A variety of boosting schemes including, but not limited to, self-boosting (SB), local self-boosting (LSB), and erase area self-boosting (EASB) may be used. As is known to those of ordinary skill in the art, the magnitude of the pass voltage may be different for different unselected word lines. Also, the magnitude of the pass voltage for a given unselected word line may depend on the relative location of that unselected word line to the word line that is selected for programming. The pass voltage may help to reduce program disturb by boosting the voltage of the channel below the memory cells. Applying a gate to source voltage to a select transistor that progressively decreases during programming may prevent or reduce leakage of the boosted channel potential. Therefore, program disturb may be prevented or reduced.

In step 822, a verification process is performed. In one embodiment, the verification is a concurrent coarse/fine verify. Referring to FIG. 7A, as one example, some memory cells that are being programmed to the A-state are verified using the VvaL level, and others that are being programmed to the A-state are verified using the Vva level. During the initial programming steps in which the memory cell's threshold is well below the final level (Vva), course programming may be applied. However, after the memory cell's threshold voltage reaches VvaL, fine programming may be used. Thus, some memory cells are verified for coarse programming, whereas other memory cells are verified for fine programming. Note that when a particular memory cell has been verified as being programmed to its intended state, it may be locked out from further programming. Note that using coarse/fine programming is not required. In one embodiment, the intermediate verify levels (e.g., VvaL, VvbL, etc.) are not used.

In step 824, it is determined whether all or almost all of the memory cells have verified that their threshold voltages are at the final target voltage for that memory cell. If so, the programming process is completed successfully (status=pass) in step 826. If all or almost all of the memory cells are not verified to have reached their final target levels, then it is determined whether the program counter (PC) is less than a maximum value such as 20. If the program counter (PC) is not less than max (step 828), then the program process has failed (step 830).

If the program counter (PC) is less than a maximum value (e.g., 20), then a determination is made whether the Vgs of a select transistor should be lowered. If the voltage is to be lowered, then the voltage is lowered in step 834. Numerous embodiments are disclosed for lowering the Vgs. Otherwise, the voltage is kept the same in step 836. Note that the Vgs is not applied until step 820.

Next, the program counter (PC) is incremented by one and the program voltage is stepped up to the next pulse in step 838. Note that the program voltage is not applied until step 820. Subsequent to step 838, the process loops back to step 820 and the set of next programming conditions are applied to the memory cells.

FIGS. 9(A)-9(H) are timing diagrams illustrating voltages during program operations, according to one embodiment. The timing diagrams depict one embodiment of programming conditions that are applied during step 820 of process 800. In various embodiments, Vgs of a select transistor is progressively decreased during programming. For example, Vgs may be lowered from one programming pulse to the next. Therefore, one or more of the programming conditions depicted in FIG. 9 may be changed relative to the last time that the programming conditions were applied. Note that this may be performed multiple times during the overall programming sequence of, for example, FIG. 8.

The voltages shown are applied to various select lines, word lines, bit lines, and the common source line of the memory array, for NAND strings under fast programming, slow programming, and program inhibition. The program operation can be grouped into a Bit Lines Precharge Phase, a Program Phase and a Discharge Phase.

Bit Lines Precharge Phase: During phase (1), the SGS transistors 406 are turned off by SGS being at Vsgs (FIG. 9(A)) while the SGD transistors 424 are turned on by SGD going high to Vsg (FIG. 9(B)), thereby allowing a bit line to access a NAND string. During phase (2), the bit line voltage of a program-inhibited NAND string is allowed to rise to a predetermined voltage given by VBL_inhibit (FIG. 9(E)). When the bit line voltage of the program-inhibited NAND string rises to VBL_inhibit, the program-inhibited NAND string will float when the gate voltage on the SGD transistor 424 drops to V_SGD, that is sufficiently low enough to cut off the SGD transistor. In one embodiment, the voltage VBL_inhibit depends on the PC of FIG. 8. In other words, VBL_inhibit may depend on which program pulse in the sequence is being applied.

At the same time, the bit line voltage of a programming NAND string is either pulled down to VBL_Select or maintained at VBL_Select if already there (FIG. 9(G)). Also during phase (2), the bit line voltage of NAND strings that are undergoing slow programming is set to an intermediate voltage given by VBL_QPW (FIG. 9(F)). The voltage VBL_QPW is between VBL_Select and VBL_inhibit. The voltage VBL_QPW allows the selected memory cell to program, but at a slower rate than if VBL_Select were used.

Also during phase (2), the voltage on the common source line is set to a voltage given by V_Cell_Source (FIG. 9(H)). In one embodiment, the voltage V_Cell_Source depends on the PC of FIG. 8. In other words, V_Cell_Source may depend on which program pulse is being applied. Note that regardless of whether a NAND string is programming, its SGS transistor 406 should be off. Having V_Cell_Source depend on which program pulse is being applied can help to keep the SGS transistors 406 off.

During phase (3), the drain select line (SGD) connecting to the SGD transistors 424 of NAND strings has its voltage lowered to V_SGD. In one embodiment, this will float only those program-inhibited NAND strings where their bit line voltage is comparable to V_SGD, since their SGD transistors 424 are turned off (FIGS. 9(B) & 9(E)). As for the NAND strings containing a memory cell to be programmed, their SGD transistors 424 will not be turned off relative to the bit line voltage (e.g., near 0V) at their drain. In one embodiment, the voltage V_SGD depends on the PC of FIG. 8. In other words, V_SGD may depend on which program pulse is being applied.

During phase (4), the memory cells in a NAND string not being programmed have their control gate voltage set to VPASS (FIG. 9(C)). Also, the memory cell being programmed may have its control gate voltage set to VPASS (FIG. 9(D)). Since a program-inhibited NAND string is floating, the VPASS applied to the control gates of the memory cells boosts up the voltages of their channels. VPASS may be set to some intermediate voltage (e.g., ~10V) relative to Vpgm (e.g., ~15-24V). Depending on the boosting scheme being used, the value of VPASS is not required to be the same for each unselected word line.

Program Phase: During phase (5), a programming voltage Vpgm is applied to the control gate of a memory cell selected for programming (FIG. 9(D)). This may be achieved by applying Vpgm to the selected word line. The memory cells under program inhibition (e.g., with boosted channels) will not be programmed. The memory cells under programming will be programmed. Note that Vpgm may also contribute to channel boosting.

In the Discharge Phase: During phase (6), the various control lines and bit lines are allowed to discharge.

Figure 10A:
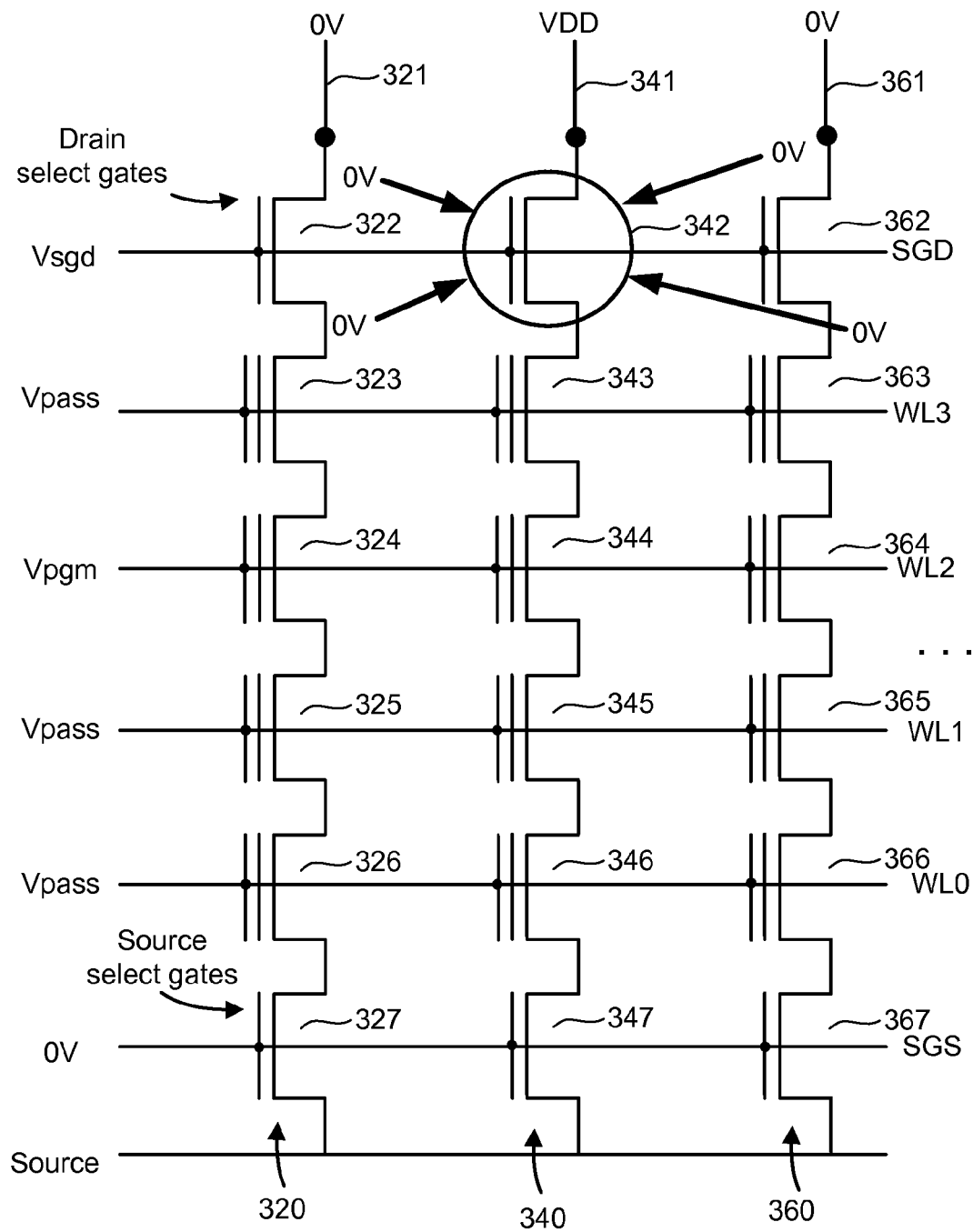
FIGS. 10A, 10B and 10C are diagrams that show voltages that might be applied to three adjacent NAND strings during programming.
Figure 10B:
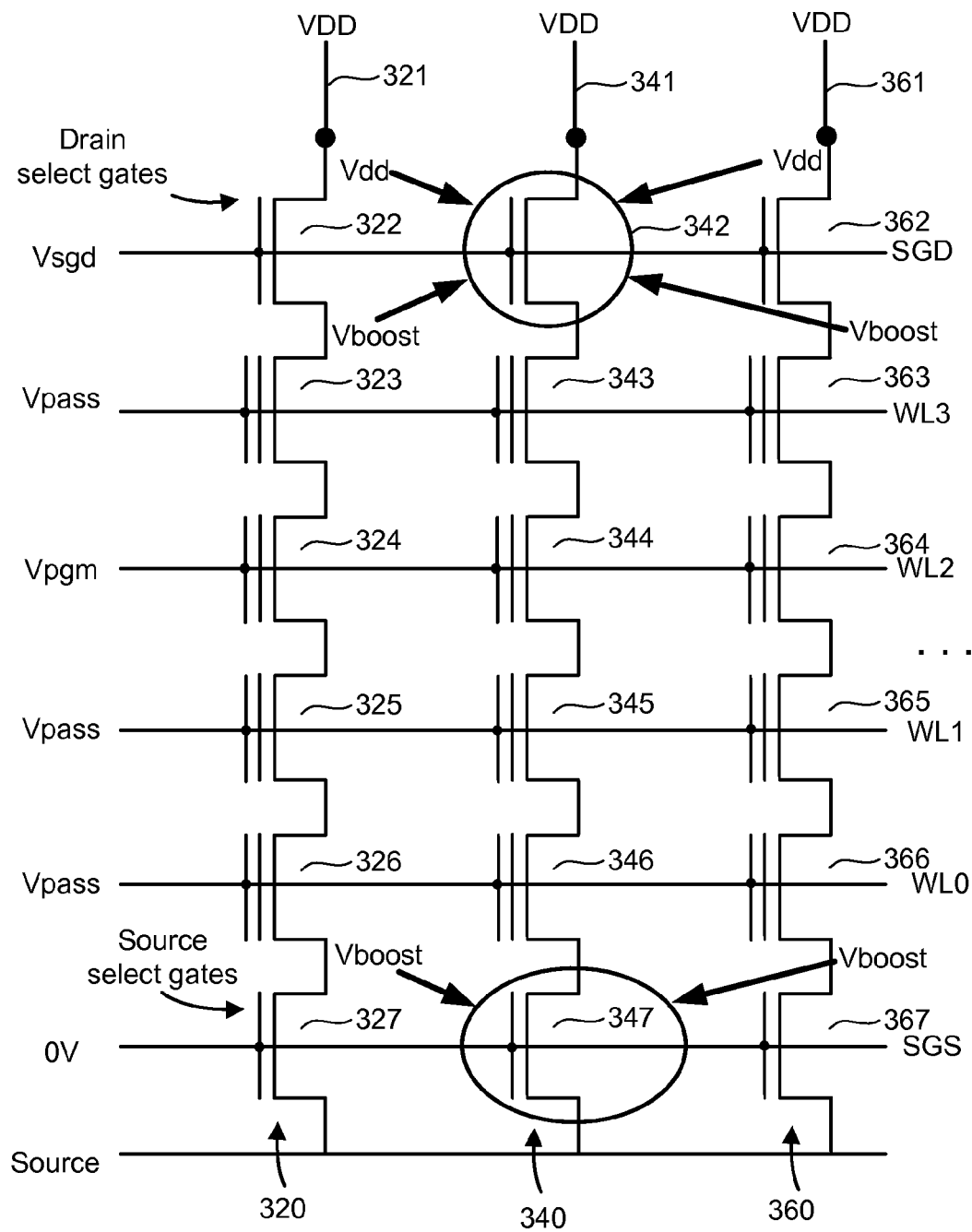

FIGS. 10A and 10B are diagrams that show voltages that might be applied to three adjacent NAND strings during programming. These figures will be referred to in order to discuss possible problems that could lead to program disturb. FIG. 10A shows possible bit line voltages for one programming pulse and FIG. 10B for the next. In FIG. 10A, the middle NAND string 340 is unselected and the two adjacent NAND strings 320 and 360 are selected for programming. In FIG. 10B, all NAND strings 320, 340, 360 are unselected.

Referring first to FIG. 10A, a programming voltage (Vpgm) is being applied to the selected word line WL2, whereas pass voltages (Vpass) are being applied to unselected word lines (WL0, WL1, WL3). Memory cells 324 and 364 are selected for programming, whereas memory cell 344 is unselected. Memory cells on the unselected word lines are also unselected. There may be many other unselected word lines, but they are not depicted.

At one end of the NAND strings, 0V is being applied to the source side select line (SGS). The common source line may be biased at V_Cell_Source that may be similar to Vdd in magnitude. This should keep off all of the source side select transistors 327, 347, 367. The middle NAND string 340 is being inhibited from programming by applying Vdd to its bit line 341. A voltage Vsgd is being applied to the drain side select line (SGD). The combination of Vsgd and Vdd should keep off select transistor 342, which will allow the channel potential of the NAND string 340 to boost. Therefore, memory cell 344 should not program. On the other hand, the combination of Vsdg and the 0V applied to the selected bit lines 321, 361 should turn on select transistors 322 and 362, which should pass 0V to the channels of NAND strings 320 and 360. Therefore, memory cells 324 and 364 should program.

The foregoing makes it clear that the drain side select gate 342 of an unselected NAND string should stay off to allow the channel potential to boost. However, if the drain side select gate 342 of an unselected NAND string were to unintentionally turn on, then the channel potential may not properly boost. Therefore, memory cell 344 could receive program disturb. For example, electrons could undesirably be injected to the floating gate of memory cell 344.

Select transistor 342 is not only affected by its own gate voltage (Vsgd applied to the SGD), but may also be impacted by voltages on neighboring NAND strings. For example, voltages in the channels of neighboring NAND strings 320, 360 could impact select transistor 342 on NAND string 340. Voltages applied to bit lines 321 and 361 could possibly impact select transistor 342 on NAND string 340, as well. Referring back to FIG. 3, the voltage to the bit lines 321, 361 may be transferred to diffusion area 432 of the drain side select transistor 424. In this case, the voltages of neighboring bit lines 321, 361 are each 0V. Also, the channel potentials of the neighboring NAND strings 320, 360 are each 0V. Referring back to FIG. 3, the channel potential that is marked as 0V could be the source drain/region 430 that is between the drain side select transistor 424 and memory cell 422. These voltages may be thought of as "side gates" to select transistor 342. Note that there is typically some type of electrical insulation between NAND strings. However, the side gate voltages could still capacitively couple to the channel of the select transistor 342.

These "side gate voltages" might not present a problem in FIG. 10A. That is, these low voltages should not unintentionally turn on the select transistor 342. However, the situation depicted in FIG. 10B is more problematic. In FIG. 10B, all three bit lines 321, 341, 361 are now biased to Vdd. This may be the case if now memory cells 324, 364 have completed programming. Thus, all three NAND strings 320, 340, 360 are now unselected.

However, it is possible for the side gate voltages to unintentionally turn on select gate transistor 342. In effect, the side gate voltages may lower the apparent Vt of the select transistor 342. If this happens, then the channel of NAND string 340 may not properly boost to a high enough potential. Therefore, program disturb to memory cell 344 could occur.

In the scenario of FIG. 10B, the neighboring bit lines 321, 361 are biased to Vdd. Therefore, select gate transistor 342 may be impacted by these side gate voltages. Also, the channels of NAND strings 320, 340 are now boosted to Vboost. The value of Vboost may depend on Vpass. Vboost might be fairly large, such as up to six volts or even higher. Note that as memory arrays continue to scale down in size, NAND strings may be closer together, which can increase this impact of the side gate voltages. Thus, the coupling of the side gate voltage to the select transistor 342 could be more of a problem as memory arrays scale down in size.

Similar problems could occur at the source side select transistor 347. For example, due to coupling of side gate voltages (e.g., Vboost) from the boosted channels of NAND strings 320 and 360, the source side select transistor 347 could be unintentionally turned on. Note that the source side select gates of all of the NAND strings (whether programming or not) should remain off.

Figure 10C:
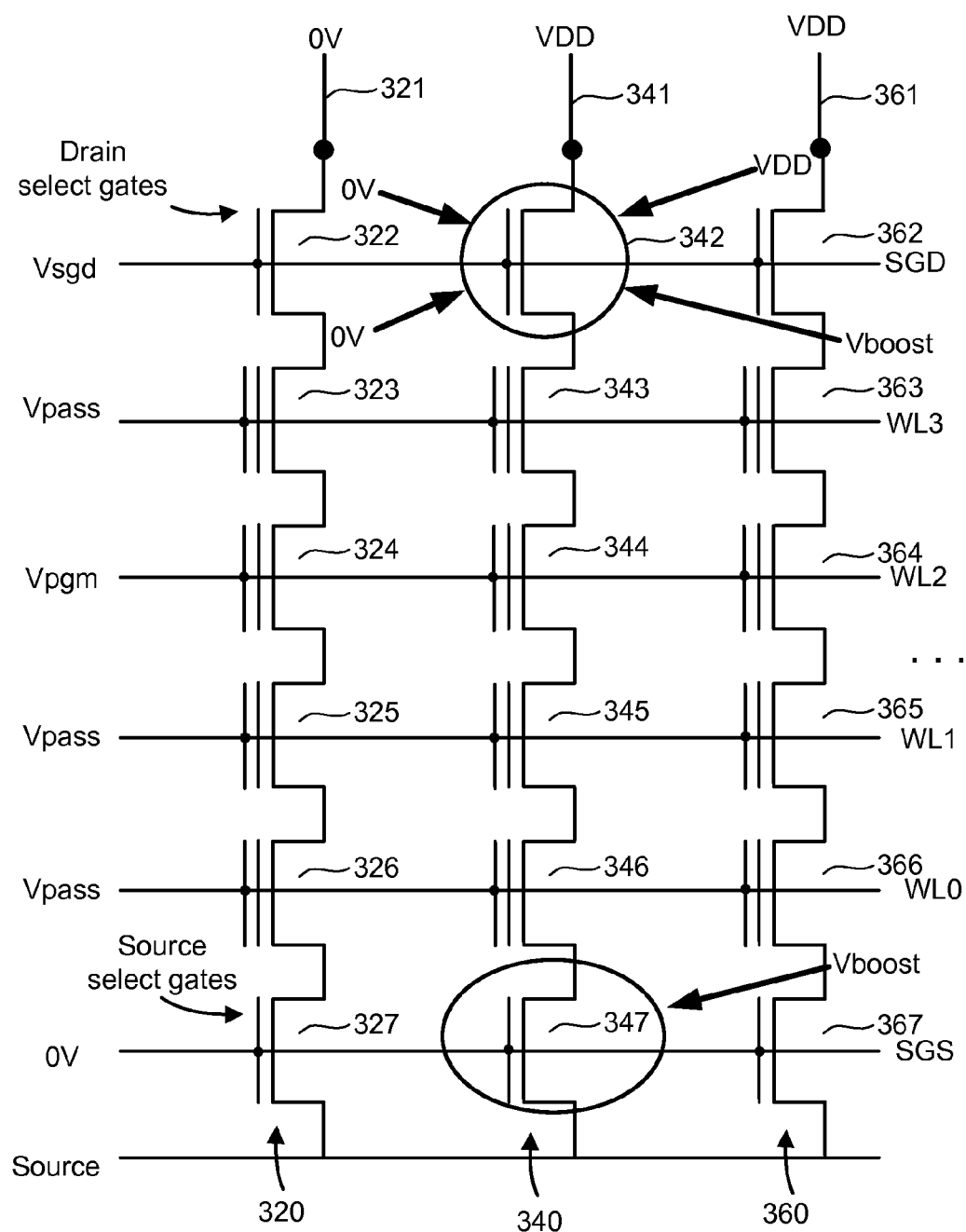

Also note that the foregoing problem does not require that both neighbor NAND strings are unselected. FIG. 10C depicts an example in which, NAND string 320 is still selected, but NAND strings 340 and 360 are unselected. In this case, NAND string 340 still may be negatively impacted by the side gate phenomenon from NAND string 360. This can be seen by comparing the side gate voltages depicted in FIG. 10A and 10C.

In one embodiment, the inhibit voltage (e.g., VDD) for an unselected NAND string depends on the programming status of its two neighbor NAND strings. If both neighbors are programming (as in FIG. 10A), then VDD is given some regular value (which may, but is not required to, depend on how far programming has progressed). If one neighbor is programming and one is inhibited (as in FIG. 10C), then VDD may be increased from the regular value (which again may, but is not required to, depend on how far programming has progressed). If both neighbors are inhibited (as in FIG. 10B), then VDD may be further increased from the regular value (which again may, but is not required to, depend on how far programming has progressed).

The foregoing provides some reasons why the bias (e.g., Vgs) on the select transistors may be important during programming. The foregoing may explain why if the bias is too high then there may be program disturb. However, if the bias is too low, then there may also be programming problems. For NAND operation, the bias, Vsgd, on the SGD transistor 424 may have an optimum range under which it should be operated for normal program and inhibit operation. If Vsgd is too high or too low, it can lead to certain issues that can either cause problems with inhibiting or programming the cells, leading to higher failure bit count (FBC). Therefore, there may be a Vsgd-window which dictates the values of Vsgd bias under which the SGD transistor 424 should be operated within.

Figure 11:
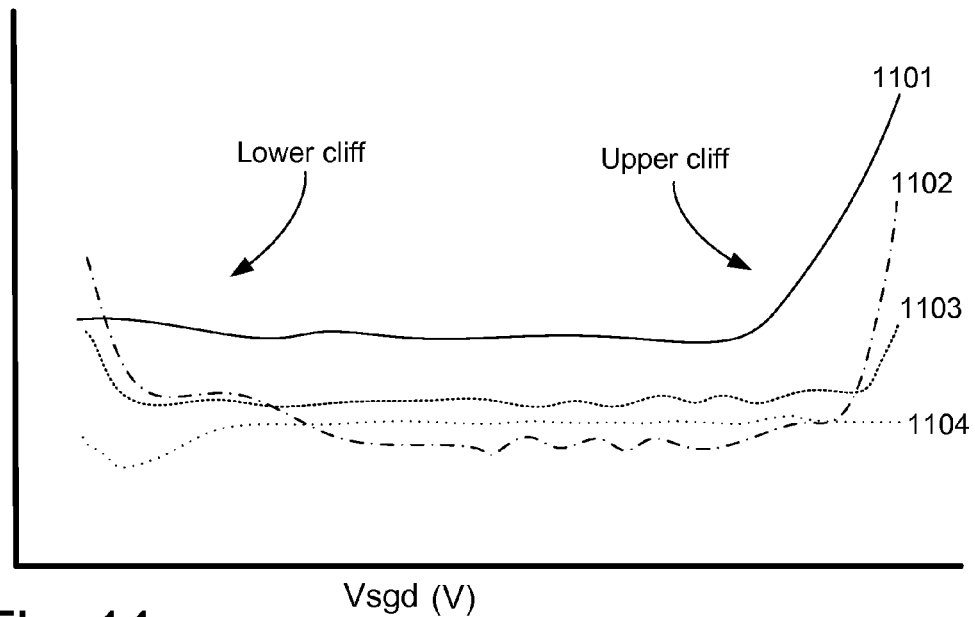
FIG. 11 shows a possible Vsgd window.

A possible Vsgd window for is shown in FIG. 11. The window shows an upper cliff and a lower cliff. Possible mechanisms governing the upper and lower cliffs of the Vsgd window are described below. Curve 1101 is for Er->X fails. Curve 1102 is for A->X fails. Curve 1103 is for B>X fails. Curve 1104 is for C->X fails. Here X represents any of the other states. For example, E->X fails comprise of all failures that cause an erased cell to be read as A- or B- or C-state.

One possible explanation for the upper cliff in FIG. 11 is the problem of the select transistor unintentionally turning on due to the side gate effect previously discussed. If Vsgd is too high, then the SGD transistor 424 will turn on and lead to boost potential leakage through the SGD transistor 424. Note that some of the boost potential could leak even if the SGD transistor 424 is only weakly on, thus resulting in program disturb. Similar reasoning applies to the SGS transistor 406. The lack of boosting could cause program disturb leading to E->A fails and eventually A->B, B->C fails, if Vsgd is further raised. Thus in practice, the upper-cliff of Vsgd window may be determined by E->X fails.

One possible explanation for the lower cliff in FIG. 11 may be associated with a slow programming mode, which may be referred to as "quick pass write" (QPW). A cell that is in QPW mode may have its associated BL biased to VBLC_QPW (e.g., 0.9V). In order to ensure that the full VBLC_QPW is passed through the SGD into the channel of the NAND string, the drain side select transistor should stay on. If Vsgd is too low, it can cause the drain side select transistor to be weakly off, which may cause the channels under QPW to get weakly boosted, thus slowing down the program speed for the associated cells more than intended. In other words, the drain side select transistor should not be weakly off for the desired programming speed. Rather, the drain side select transistor should be on to pass VBLC_QPW to the channel of the NAND string.

The following will present a hypothetical similar to the one discussed with respect to FIG. 10A and 10B, but in which the middle NAND string is undergoing slow programming (instead of being inhibited). As noted, if Vsgd is too low, then the drain side select gate 424 may be weakly off, instead of on. Its neighbors might be in full or slow programming mode. Thus, the neighbor channels are initially either at 0V or 0.9V, as example voltages. At some point, one or both neighbors complete programming. With the next programming pulse, that neighbor has its bit line biased to Vdd. Thus, their channels will be boosted up to Vboost. Due to this change in the neighbors' channel state (as well as bit line), the select transistor on the middle NAND string might now turn on. Therefore, VBLC_QPW is now passed to the channel of the middle NAND string. Consequently, the programming speed may suddenly increase, which could lead to over-programming. Note that it is not required for techniques described herein to solve both the upper cliff and the lower cliff problem.

Note that as programming progresses, more are more unselected NAND strings have one or two neighbors that are unselected. Thus more unselected NAND strings will be under a situation as depicted in FIG. 10B or 10C, and fewer NAND strings will be under a situation as depicted in FIG. 10A. Statistically, this may lower the average apparent select transistor Vt. By apparent Vt is it meant that the Vt may not actually change, but that the side gate effect may make it appear that the Vt has decreased. This may, in effect, lower the upper cliff. In other word, as the program progresses from first pulse to the last pulse, at each program pulse, more and more cells reach their target level and hence get inhibited. Thus, statistically, the apparent select gate Vt may be lowered as the program pulse number increases, which may make the upper-cliff shift lower as the program pulse number increases. In one embodiment, a program pulse number dependent Vsgd bias is used counter-act the above described side gate effect, and hence widen the effective Vsgd window for the complete program operation.

Figure 12:
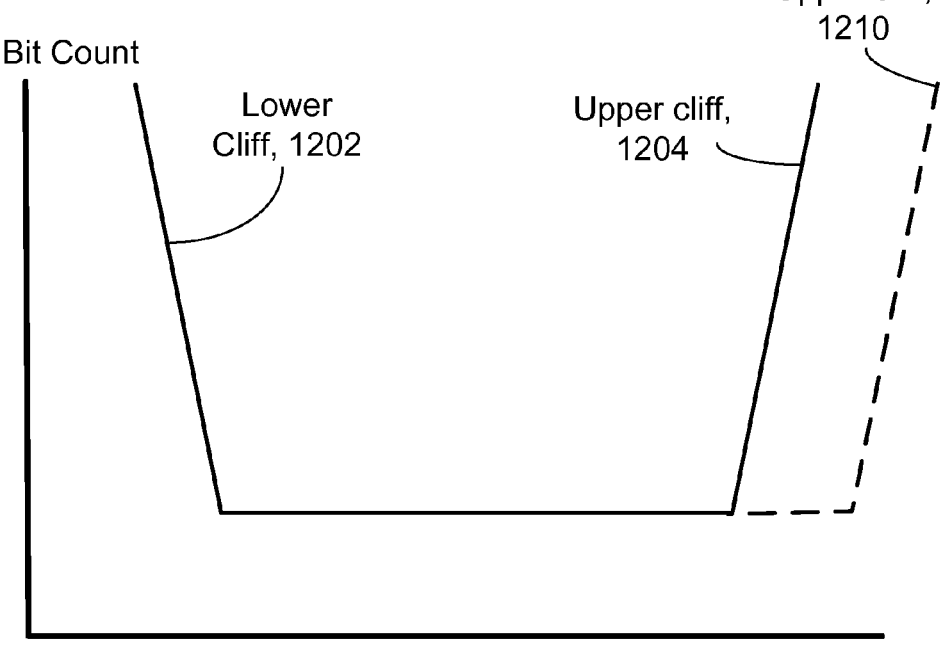
FIG. 12 depicts a possible shift to the upper cliff with any adjustments to the Vgs of select transistors as programming progresses.

In one embodiment, the window between the lower and upper cliff is widened by shifting the upper cliff to the right. This is depicted in FIG. 12. FIG. 12 depicts a possible lower cliff 1202 and upper cliff 1204 without any adjustments to the Vgs of select transistors as programming progresses. Upper cliff 1210 represents an effective widening of the Vsgd window that may be achieved by one embodiment of decreasing the Vgs of select transistors as programming progresses.

In one embodiment, upper cliff 1210 may be achieved by increasing the inhibit voltage that is applied to unselected NAND strings as programming progresses. When the inhibit voltage is increased, Vsgd can go to a higher value before the drain side select transistors unintentionally turn on. Therefore, the upper cliff of the Vsgd window improves. However, the lower cliff mechanism is not harmed since the lower cliff may be dependent on the selected bit line bias. Note that the selected bit line bias is not changed.

As noted above, in one embodiment, the magnitude of the inhibit voltage depends on the programming status of its two neighbor NAND strings. For a given inhibited NAND string, if its neighbor NAND strings are inhibited, it may make the Vt of SGD appear lower, which makes it harder to cut off. By raising the bit line bias (e.g., Vdd) associated with the unselected bit line, SGD is easier to cut off. Therefore, the neighbor NAND string effect may be countered by using this approach. In one embodiment, there is circuitry that communicates between neighbor NAND string's sense amplifiers 300, such that one sense amplifier 300 can know the program status of NAND strings associated with neighboring sense amplifiers 300.

Figure 13:
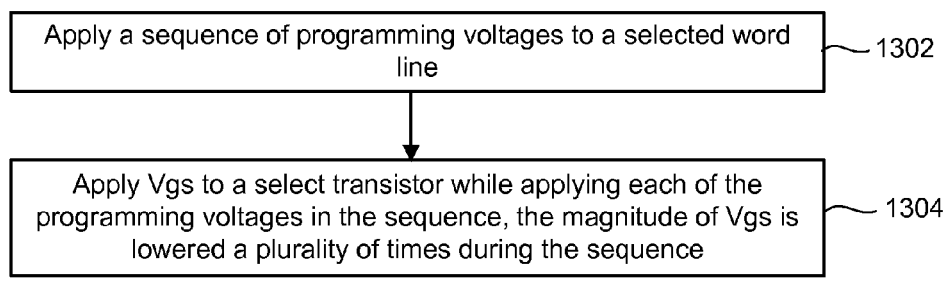
FIG. 13 is a flowchart of one embodiment of a process of applying programming conditions.

FIG. 13 is a flowchart of one embodiment of a process 1300 of applying programming conditions. Process 1300 progressively decreases a Vgs bias to a select transistor (e.g., 406, 424) with increasing number of program loops. The process 1300 may be used in one embodiment of step 820 from FIG. 8. In general, process 1300 covers multiple iterations of step 820 (applying programming conditions). Process 1300 may prevent or reduce program disturb. Process 1300 may be used when programming NAND strings.

In step 1302, a sequence of programming pulses are applied to a selected word line. For example, one voltage pulse could be applied with each iteration of step 820 of process 800 (see also, Vpgm in FIG. 9(D)). In step 1304, a Vgs is applied to a select transistor 406, 424 while applying each of the programming voltages. This may be applied during the program phase of FIG. 9. The magnitude of the Vgs may be progressively lowered multiple times during the programming. The magnitude may be lowered a plurality of times during the sequence of programming voltages. By this it is meant that the magnitude of the Vgs may be lowered from some programming pulse to the next, then again lowered from some programming pulse to the next.

In one embodiment of step 1304, the select transistor is a drain side select transistor 424. One embodiment of step 1304 includes applying a voltage to a select line associated with the drain side select transistor that is lowered more than once during the sequence of programming voltages. In one embodiment, the magnitude of Vgs is lowered for at least two consecutive programming voltages in the sequence.

The voltage that is applied to the select transistor in step 1304 is not necessarily a gate-to-source voltage. For example, the voltage could be a base to emitter voltage in the event that the select transistor is a bipolar junction transistor (BJT). In one embodiment, the select transistor may have a first terminal (e.g., diffusion region 432 or diffusion region 431) that is coupled to either a bit line or a common source line, and a second terminal (e.g., gate) that is coupled to a select line. In one embodiment, step 1304 includes applying a second terminal to first terminal voltage to a select transistor.

In one embodiment, the select transistor is a drain side select transistor 424 of an unselected NAND string. One embodiment of step 1304 includes applying a voltage to a bit line associated with (e.g., coupled to) the unselected NAND string that is lowered more than once during the sequence of programming voltages.

In one embodiment, the select transistor is a source side select transistor 406. One embodiment of step 1304 includes applying a voltage to a select line associated with (e.g., coupled to) the source side select transistor that is lowered more than once during the sequence of programming voltages.

Figure 14:
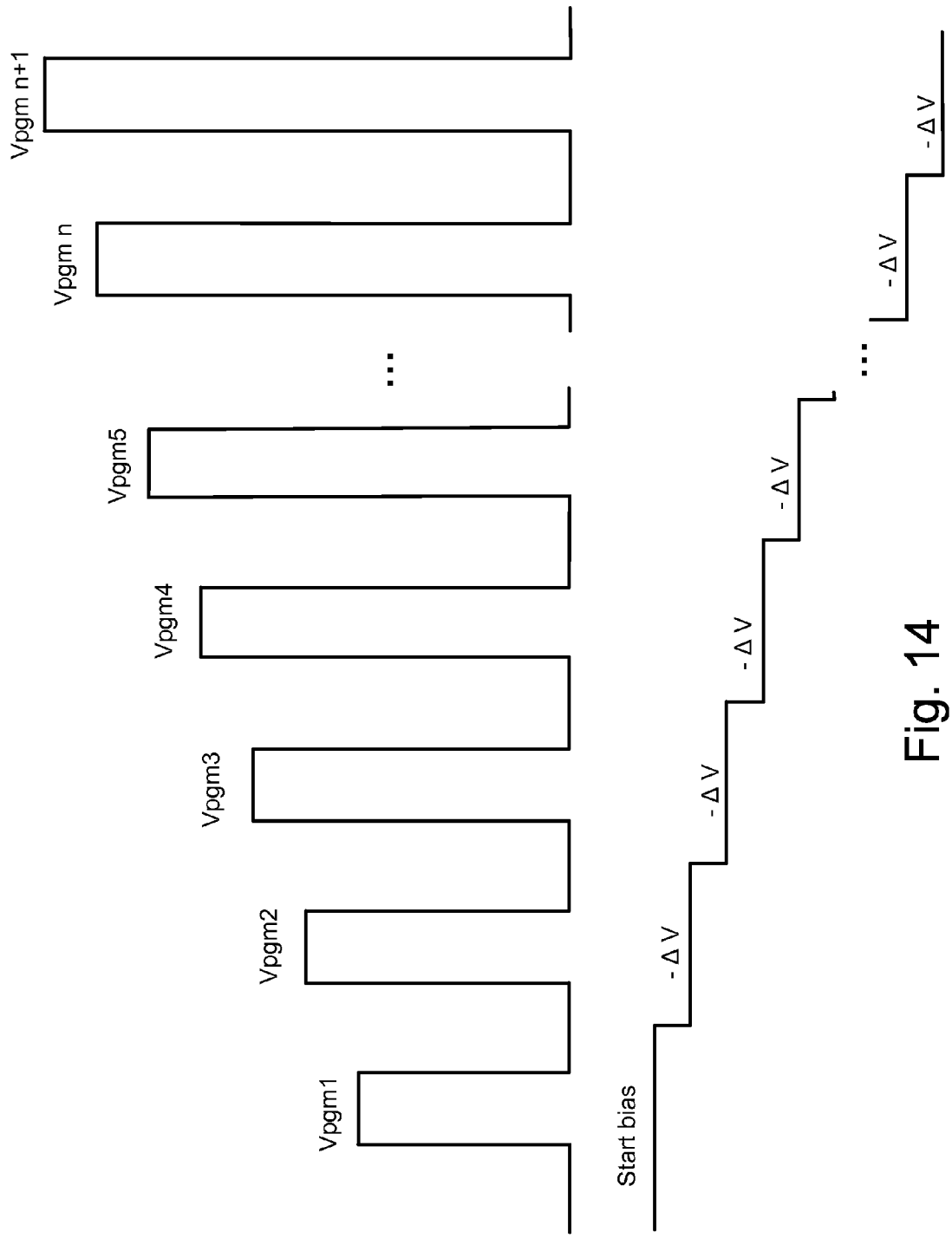
FIG. 14 depicts one example of a sequence of programming voltages and Vgs that may be used in the process of FIG. 13.

FIG. 14 depicts one example of a sequence of programming voltages and Vgs that may be used in process 1300. The sequence of program voltages (or pulses) are labeled Vpgm1 to Vpgm n+1. One programming pulse may be applied with each iteration of step 820 of process 800, for example. In this example, the programming pulses increase in magnitude with each successive pulse. However, this increasing pattern is not a requirement. A break is depicted between Vpgm5 and Vpgm n to indicate that any number of pulses may be used. It is not required that all the pulses are used, as programming could complete with fewer pulses than depicted in FIG. 14.

Also depicted are Vgs applied to a select transistor 406, 424. This may be a drain side select transistor 424, a source side select transistor 406, or both. The Vgs starts at a "start bias" and decreases by some increment with each program pulse in this example. It is not required that the bias (e.g., Vgs) decrease with each program pulse. As one example, the bias might decrease by 25 mV with each iteration of process 800. The decrease could be larger or smaller. The bias is not required to decrease by the same amount each time. Numerous techniques are disclosed herein for applying the bias to the select transistor.

Figure 15:
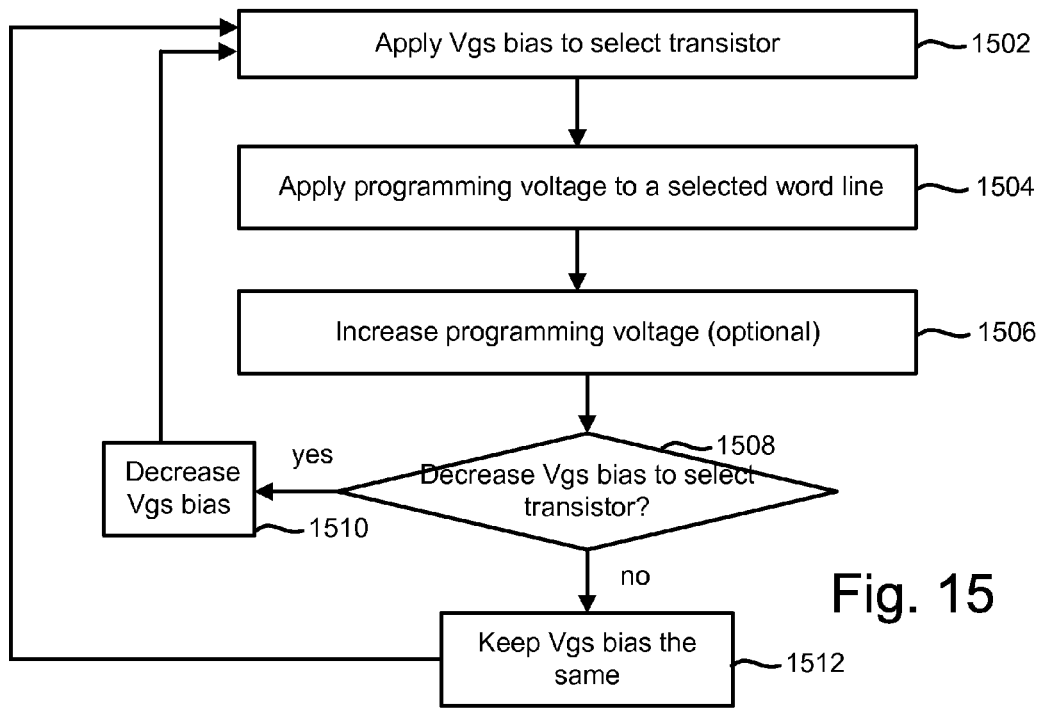
FIG. 15 depicts further details for one embodiment of the process of FIG. 13.

FIG. 15 depicts further details for one embodiment of process 1300. In step 1502, a bias is applied to a select transistor. In one embodiment, this is a Vgs bias. In step 1504, a programming voltage is applied to a selected word line. In step 1506, the programming voltage is optionally increased. In step 1508, a determination is made whether to decrease the Vgs bias on the select gate transistor. The Vgs bias may be decreased in step 1510 or kept the same in step 1512. Then, the process 1500 returns to step 1502.

Figure 16A:
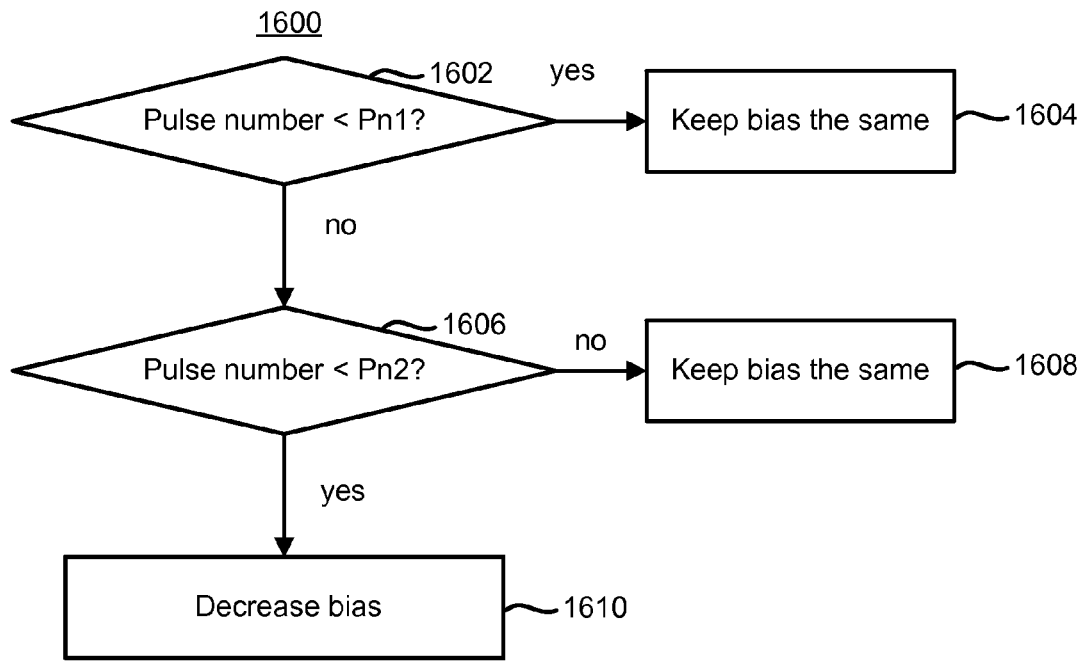
FIG. 16A is a flowchart of one embodiment of a process of determining whether to decrease the bias to the select transistor.

FIG. 16A is a flowchart of one embodiment of a process 1600 of determining whether to decrease the bias to the select transistor. In one embodiment, this is a Vgs bias. The process 1600 may be used to implement step 1508 of process 1500. Thus, process 1600 may be used multiple times during process 1500. Reference will be made to the example sequence of biases depicted in FIG. 16B. Voltage pulses are not explicitly depicted in FIG. 16B. However, the labels "P1," "P2," refer to the number of the program pulse in a sequence of pulses used in process such as the embodiment of FIG. 8. The bias starts at V_bias_start at pulse P1. The bias decreases by some increment at pulse "n1." Then, the bias continues to decrease by some increment until pulse "n2" is reached. At this point, the bias remains at V_bias_end for any additional iterations (e.g., program loops).

Referring now to process 1600, in step 1602 a determination is made whether the pulse number is less than "n1". N1 may be any number of program pulses. If it is less than pulse n1, then the bias for the select transistor is kept the same (step 1604). If the pulse is not less than "n1" then it is determined whether the pulse number is less than "n2," in step 1606. N2 is a number greater than n1. If the pulse number is greater than n2, then the bias is kept the same (step 1608). If the pulse number is less than n2, then the bias is decreased in step 1610.

Figure 17A:
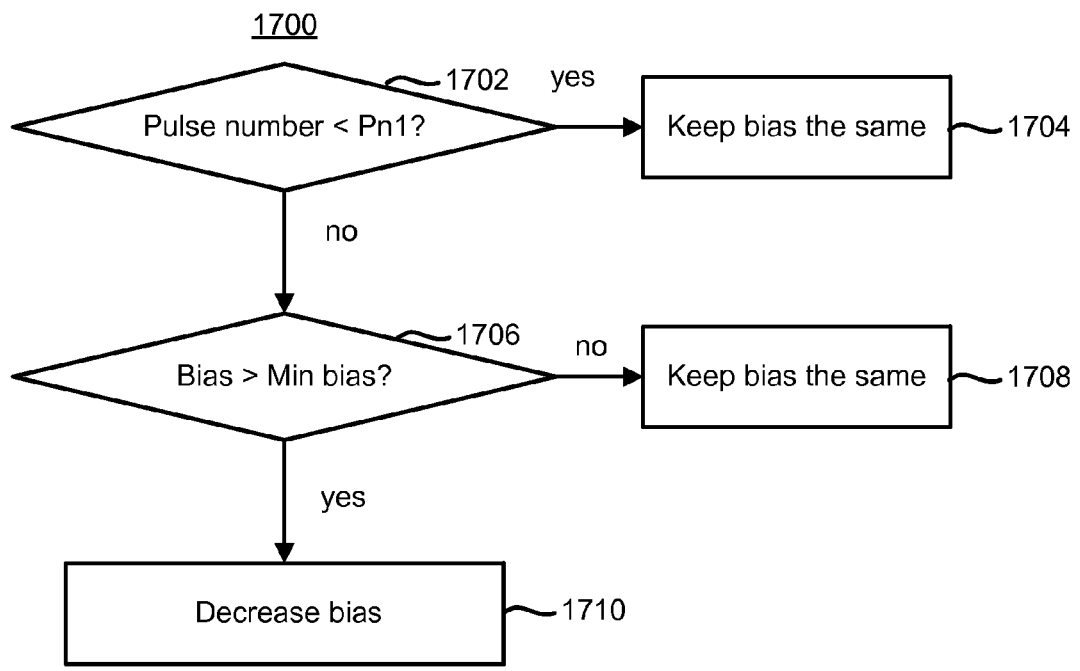
FIG. 17A is a flowchart of one embodiment of a process of determining whether to decrease the bias to the select transistor.

FIG. 17A is a flowchart of one embodiment of a process 1700 of determining whether to decrease the bias to the select transistor. In one embodiment, this is a Vgs bias. The process 1700 may be used to implement step 1508 of process 1500. Thus, process 1700 may be used multiple times during process 1500. Reference will be made to the example sequence of biases depicted in FIG. 17B. Voltage pulses are not explicitly depicted in FIG. 17B. However, the labels "P1," "P2," refer to the number of the program pulse in a sequence of pulses used in process such as the embodiment of FIG. 8. The bias starts at V_bias_start at pulse P1. This is not necessarily the same bias as the one depicted in FIG. 16B. The bias decreases by some increment at pulse "n1." Then, the bias continues to decrease by some increment until the bias reaches a minimum voltage. At this point, the bias is held at V_bias_min for any additional iterations (e.g., program loops).

Referring now to process 1700, in step 1702 a determination is made whether the pulse number is less than "n1". N1 may be any number of program pulses. Note that this may be a different n1 than the one referred to in FIG. 16A. If the pulse number is less than pulse n1, then the bias for the select transistor is kept the same (step 1704). If the pulse is not less than "n1" then it is determined whether the present bias value is less than a minimum bias, in step 1706. Lowering the bias by too much could make it difficult for the drain side select transistor to turn on, for those selected NAND strings for which the drain side select transistor should be on. If the present bias value is at the minimum bias, then the bias is kept the same (step 1708). If the present bias value is greater than the minimum bias, then the bias is decreased in step 1710.

Figure 17C:
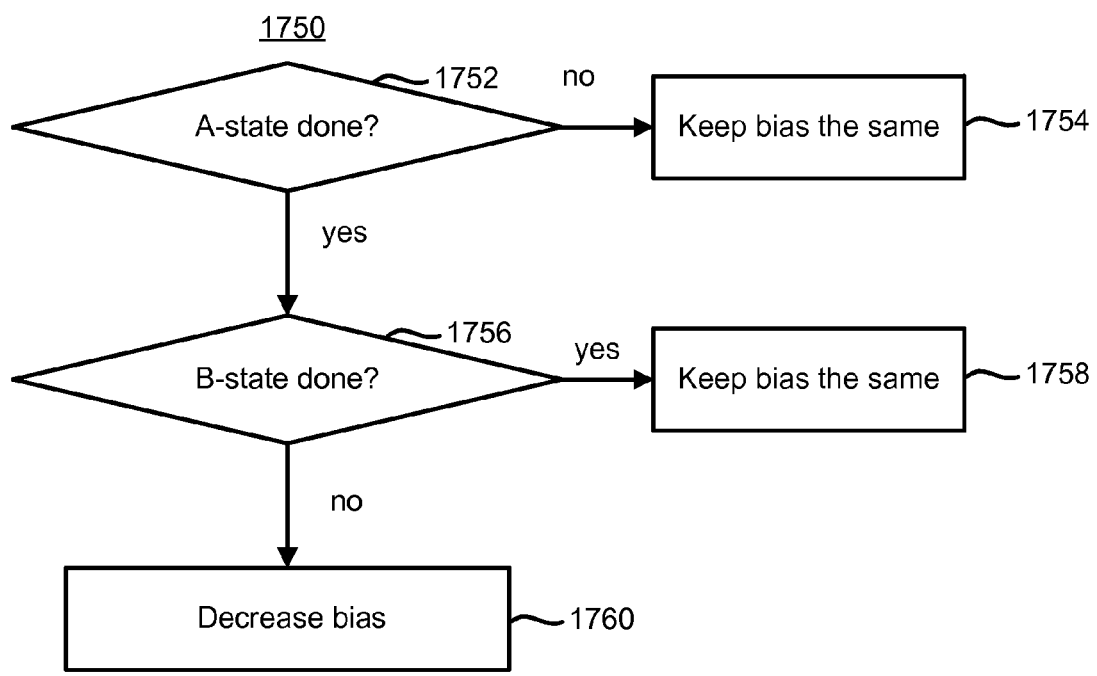
FIG. 17C is a flowchart of one embodiment of a process in which completion of programming a state is are used to trigger starting or stopping the decrease to the Vgs bias of select transistors.

In some embodiments, the determination of when to start or stop decreasing Vgs of the select transistors is based on completion of programming a certain state. For example, rather than starting to decrease the bias when the pulse count hits PN1, this could occur when some state has completed programming. As another example, rather than stopping the decrease to the bias when the pulse count hits PN2, this could occur when some state has completed programming. FIG. 17C is a flowchart of one embodiment of a process 1750, in which completion of programming the A-state and B-state are used to trigger starting or stopping the decrease to the bias. Other states could be used.

In step 1752, a determination is made whether the A-state has completed programming. Note that all memory cells that are targeted for the A-state do not need to reach the target level for programming of the A-state to be complete. If it is not, then the bias is kept the same (step 1754). If the A-state is done, then a determination is made (step 1756) whether the B-state is also done. If so, then the bias is not decreased (step 1758). However, if the B-state is not done, then the bias is decreased, in step 1760. In effect, the bias is decreased after the A-state is done, but the B-state is still programming. This could be modified by waiting one or more pulses after completion of the A-state to start decreasing the bias, or waiting one or more pulses after completion of the B-state to stop decreasing the bias.

Note that testing for completion of a state may help to account for differences in programming speed from WL to WL or from chip to chip. If such differences are determined, they can also be factored into algorithms that are based on pulse count. Thus, in the processes of FIGS. 16A and 17A, the values for the pulse counts (e.g., PN1, PN2) may vary based on WL, block, chip, etc.

Note that there are many possible programming sequences that may be used. For example, the order in which the states are programmed can be quite varied. Thus, the test for which states are done to start or stop decreasing the bias may depend on what sequence the states are programmed.

Figure 18A:
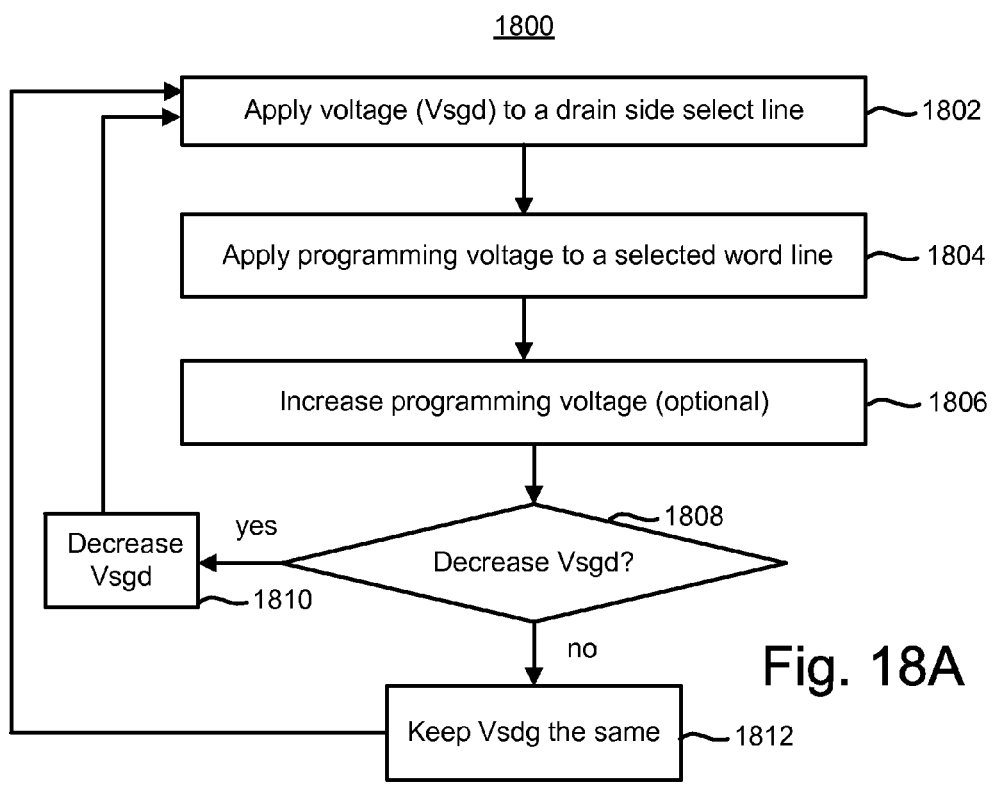
FIG. 18A is a flowchart of one embodiment of a process of decreasing the bias applied to the drain select transistor as programming progresses.

In one embodiment, decreasing the bias applied to the select transistor includes decreasing a voltage applied to a select line of a drain side select transistor 424. FIG. 18A is a flowchart of one embodiment of a process 1800 of decreasing the bias applied to the drain side select transistor as programming progresses. FIG. 18B and 18C are two example sequences of Vsgd that may be applied during process 1800.

In step 1802, a voltage is applied to a drain side select transistor. For example, Vsgd is applied to SGD as depicted in the program stage in FIG. 9(B). In one embodiment, this voltage along with a bit line voltage causes a Vgs. For drain side select transistors of unselected NAND strings the Vgs may be based on the difference between Vsgd and VBL_inhibit. An example of VBL_inhibit is Vdd. As noted, it may be desirable to keep the drain side select transistors of unselected NAND strings off. Note that if the value of Vsgd is too high, then these drain side select transistors may undesirably turn on. Also note that the further into the programming cycle (e.g., higher number of program loops), the apparent Vt of drain side select transistors of unselected NAND strings may drop due to the side gate effect. In one embodiment, the value of Vsgd is decreased progressively with higher number of program loops such that the drain side select gate transistors of unselected NAND strings are kept off. Therefore, program disturb may be prevented or reduced.

For drain side select transistors of selected NAND strings, the Vgs may be based on the difference between Vsgd and VBL_select. An example of VBL_select is 0V. As noted, it may be desirable to keep the drain side select transistors of selected NAND strings on so that the bit line voltage may pass to the channel of the selected NAND string.

For drain side select transistors of NAND strings to receive slow programming, the Vgs may be based on the difference between Vsgd and VBL_QPW. An example of VBL_QPW is 0.8V. As noted, it may be desirable to keep the drain side select transistors of NAND strings to receive slow programming on so that the VBL_QPW voltage may pass to the channel of the selected NAND string.

In step 1804, a programming voltage is applied to a selected word line. For example, the voltage Vpgm is applied to the selected word line during the program phase depicted in FIG. 9(D). Also note that a boosting voltage such as Vpass may be applied to unselected word lines (FIG. 9(C)), such that the channel potential of unselected word lines may boost.

In step 1806, the programming voltage is optionally increased. In step 1808, a determination is made whether to decrease Vsgd. Vsgd may be decreased in step 1810 or kept the same in step 1812. A process such as the embodiment of FIG. 16A, the embodiment of FIG. 17A, or the embodiment of FIG. 17C may be used to make the determination. Then, the process 1800 returns to step 1802.

In one embodiment, step 1810 includes lowering the magnitude of Vsgd from one of the programming voltages in the sequence to the next programming voltage in the sequence without lowering the maximum voltage applied to selected bit lines from one programming voltage in the sequence to the next programming voltage in the sequence. For example, Vsgd may be lowered without lowering VBL_Inhibit or VBL_QPW.

FIG. 18B depicts a sequence of Vsgd that may be used in process 1800. The sequence is similar to the one in FIG. 16B. Voltage pulses are not explicitly depicted in FIG. 18B. The bias starts at V_sgd_start at pulse P1. Vsgd decreases by some amount at pulse "n1." Then, Vsgd continues to decrease by some amount until pulse "n2" is reached. At this point, Vsgd is stabilized at V_bias_end for additional program loops.

FIG. 18C depicts a sequence of Vsgd that may be used in process 1800. The sequence is similar to the one in FIG. 17B. Voltage pulses are not explicitly depicted in FIG. 18C. The bias starts at V_sgd_start at pulse P1. Vsgd decreases by some amount at pulse "n1." Then, Vsgd continues to decrease by some amount until a minimum value for Vsgd is reached. As noted above, the value of Vsgd should remain high enough to keep on the drain side select transistor of selected NAND strings (both fast and slow programming). At this point, Vsgd is stabilized at V_sgd_min for additional program loops.

Another technique that may be used to decrease the bias to the drain side select transistor 424 is to increase the inhibit voltage as programming progresses. Note that this only affects the unselected NAND strings. FIG. 19A is a flowchart of one embodiment of a process 1900 of increasing the BL inhibit voltage as programming progresses. FIG. 19B is an example sequence of VBL_inhibit that may be applied during process 1900.

In optional step 1901, the magnitude of VBL_Inhibit is adjusted based on the programming status of neighbor NAND strings. This is further discussed with respect to FIG. 19C.

In step 1902, a voltage is applied to unselected bit lines. For example, VBL_inhibit is applied to the unselected bit lines as depicted in the program stage in FIG. 9(E). In one embodiment, this BL voltage along with Vsgd causes a Vgs for select transistors of unselected NAND strings. In this case, the Vgs may be based on the difference between Vsgd and VBL_inhibit. In one embodiment, the value of VBL_inhibit is increased progressively with higher number of program loops such that the select gate transistors of unselected NAND strings are kept off. Therefore, program disturb is prevented or reduced. Note that, from the point of view of select gate transistors of the unselected NAND strings, increasing VBL_inhibit or reducing Vsgd have similar effects. Both tend to help turn off the select gate transistors associated with the unselected NAND strings.

In one embodiment, the value of Vsgd is kept the same from one programing phase to the next. In one embodiment, the value of Vsgd is decreased and VBL_inhibit is increased from one programing phase to the next. In one embodiment, for some of the program loops, the value of VBL_inhibit is increased, whereas for other program loops the value of Vsgd is decreased.

In step 1904, a programming voltage is applied to a selected word line. For example, the voltage Vpgm is applied to the selected word line during the program phase depicted in FIG. 9(D). Also note that a boosting voltage such as Vpass may be applied to unselected word lines, such that the channel potential of unselected word lines may boost.

In step 1906, the programming voltage is optionally increased. In step 1908, a determination is made whether to increase VBL_inhibit. VBL_inhibit may be increased in step 1910 or kept the same in step 1912. A process such as the embodiment of FIG. 16A, the embodiment of FIG. 17A, or the embodiment of FIG. 17C may be used to make the determination. Then, the process 1900 returns to step 1902.

FIG. 19B depicts a sequence of VBL_inhibit that may be used in process 1900. Voltage pulses are not explicitly depicted in FIG. 19B. VBL_inhibit starts at Vdd low at pulse P1. VBL_inhibit increases by some amount at pulse "n1." This amount is represented as +Δ Vdd. Then, VBL_inhibit continues to increase by some amount with each pule until pulse "n2" is reached. Note that +Δ Vdd is not required to be the same amount each program loop. At pulse n2, VBL_inhibit is stabilized at Vdd nominal for additional program loops. By starting below Vdd nominal and working up (as opposed to starting from Vdd nominal), power consumption may be reduced.

In one embodiment, the inhibit voltage for a given NAND string depends on the programming status of its neighbors. FIG. 19C depicts a flowchart of one embodiment of a process 1950 of applying a voltage to a bit line associated with an unselected bit line that depends on the programming status of the adjacent NAND strings. This process may be used with or without decreasing Vgs of a select gate as programming progresses. This process may be used in step 1901 of process 1900. However, it is not required that this process 1950 be used with process 1900. Process 1950 may be used with process 1300, or another process that lowers Vgs during a programming sequence. In one embodiment, process 1950 is used to determine bit line voltages for unselected NAND strings for step 1304 of process 1300. Process 1950 may be performed as a part of applying programming conditions, such as step 820 of FIG. 8.

In step 1952, the programming status of the neighbor NAND strings is accessed. For example, the programming status of a first and a second NAND string adjacent to an unselected NAND string are accessed. By programming status of a NAND string it is meant whether a memory cell associated with a selected word line that NAND string is undergoing programming or is being inhibited. A memory cell that is undergoing slow programming (e.g., QPW) may be considered to be programming. In one embodiment, this information is communicated from the sense amplifier 300 associated with one NAND string and the sense amplifier 300 associated with its neighbor NAND string. Step 1952 may be performed during or prior to phase (1) shown in FIG. 9.

In step 1954, a voltage is applied to a bit line associated with the unselected bit line that depends on the programming status of the adjacent (or neighbor) NAND strings. FIG. 19D shows details of one embodiment of step 1954. Step 1954 may be used to determine a magnitude for VBL_Inhibit to be applied as shown in FIG. 9E.

FIG. 19D shows details of one embodiment of a process 1960 of determining an inhibit voltage to apply to an unselected NAND string. As noted, the process 1960 may be used in one embodiment of step 1954 of process 1950.

If both neighbors are programming (step 1962=yes), then VBL_inhibit is set to a low magnitude, in step 1964. This magnitude may be based on the program loop, but is not required to be. In one embodiment, this low value is the value determined in either step 1910 or 1912 of process 1900. However, the low magnitude does not need to be based on the program loop count. In one embodiment, the low magnitude of VBL_inhibit is independent of loop count.

If one but not both neighbors are programming (step 1966=yes), then VBL_inhibit is set to a medium magnitude, in step 1968. This magnitude may be based on the program loop count, but is not required to be. In one embodiment, this medium value is slightly greater than the value determined in either step 1910 or 1912 of process 1900. However, the medium magnitude does not need to be based on the program loop count. In one embodiment, the medium magnitude of VBL_inhibit is independent of loop count. In one embodiment, the medium magnitude is the low magnitude plus dVDD. An example of dVDD is about 0.1V; however, dVDD could be higher or lower.

If neither neighbor is programming (step 1966=no), then VBL_inhibit is set to a high magnitude, in step 1970. This magnitude may be based on the program loop. In one embodiment, this high magnitude is based on the value determined in either step 1910 or 1912 of process 1900. However, the high magnitude does not need to be based on the program loop count. In one embodiment, the high magnitude of VBL_inhibit is independent of loop count. In one embodiment, the high magnitude is the low magnitude plus 2dVDD.

The magnitudes for low, medium, and high VBL_inhibit that are selected in process 1960 are relative to each other. Note that a low magnitude established in step 1964 could be greater than a high magnitude established in step 1970 that is performed for a different program loop. For example, referring to FIG. 19B, the magnitude for VDD is increased as programming progresses. The magnitude of VDD in FIG. 19B could be the low (or regular) value selected in step 1956. However, as noted, the magnitudes for low, medium, and high VBL_inhibit may be independent of program loop count. Also, process 1960 may be used without decreasing Vgs as programming progresses. In this case, the value for VBL_inhibit low could be a nominal value. Thus, the medium and high values may be increases from this nominal value.

Figure 20A:
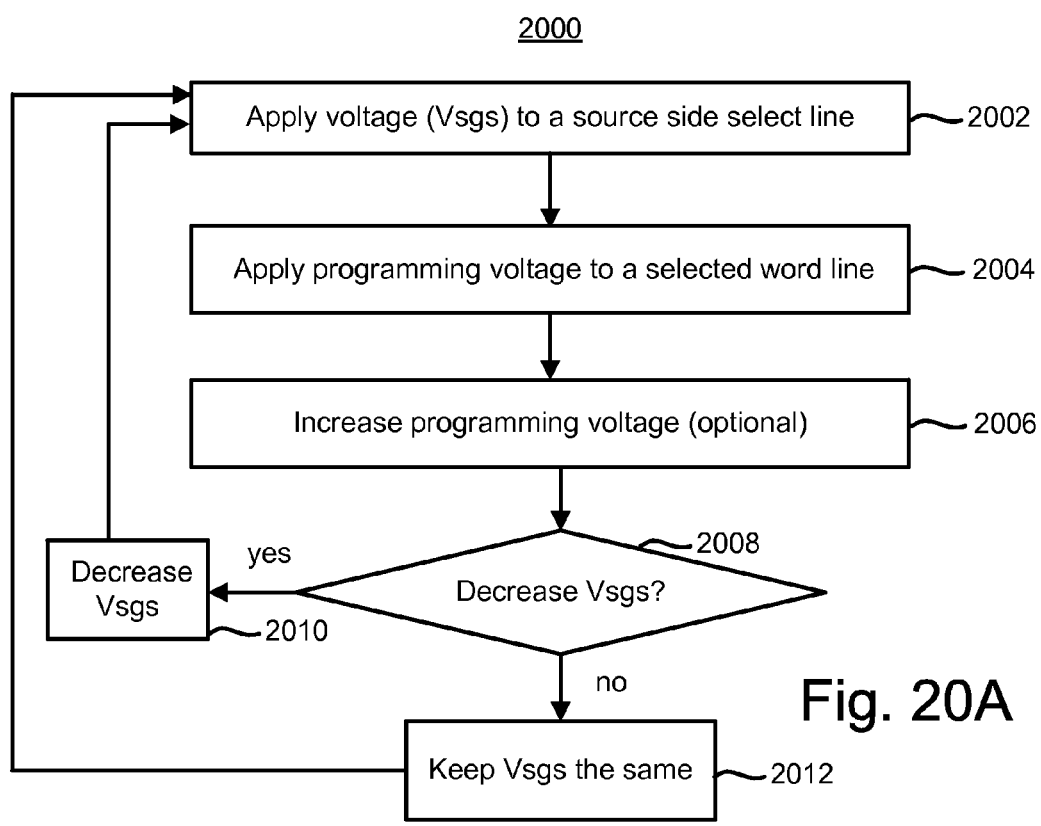
FIG. 20A is a flowchart of one embodiment of a process of decreasing the bias applied to the source side select transistor as programming progresses.

In one embodiment, decreasing the bias applied to the select transistor includes decreasing a voltage applied to a select line of a source side select transistor 406. FIG. 20A is a flowchart of one embodiment of a process 2000 of decreasing the bias applied to the source side select transistor as programming progresses. FIG. 20B and 20C are two example sequences of Vsgs that may be applied during process 2000.

In step 2002, a voltage is applied to a source side select transistor. For example, Vsgs is applied to SGS as depicted in the program stage in FIG. 9(A). In one embodiment, this voltage along with a common source line voltage (e.g., V_Cell_Source in FIG. 9(H)) causes a Vgs for source side select transistors. As noted, it may be desirable to keep the source side select transistors of all the NAND strings off. Note that if the value of Vsgs is too high, then these source side select transistors may undesirably turn on. Also note that the further into the programming cycle (e.g., higher number of program loops), the apparent Vt of source side select transistors of unselected NAND strings may drop due to the side gate effect. In one embodiment, the value of Vsgs is decreased progressively with higher number of program loops such that the source side select gate transistors of all the NAND strings are kept off. Therefore, program disturb may be prevented or reduced on unselected NAND strings.

In step 2004, a programming voltage is applied to a selected word line. For example, the voltage Vpgm is applied to the selected word line during the program phase depicted in FIG. 9(D). Also note that a boosting voltage such as Vpass may be applied to unselected word lines (FIG. 9(C)), such that the channel potential of unselected word lines may boost.

In step 2006, the programming voltage is optionally increased. In step 2008, a determination is made whether to decrease the Vsgs. Vsgs may be decreased in step 2010 or kept the same in step 2012. A process such as the embodiment of FIG. 16A, the embodiment of FIG. 17A or the embodiment of FIG. 17C may be used to make the determination. Then, the process 2000 returns to step 2002.

FIG. 20B depicts a sequence of Vsgs that may be used in process 2000. The sequence is similar to the one in FIG. 16B. Voltage pulses are not explicitly depicted in FIG. 20B. The bias starts at Vsgs_start at pulse P1. Vsgs decreases by some amount at pulse "n1." Then, Vsgs continues to decrease by some amount until pulse "n2" is reached. At this point, Vsgs is stabilized at Vsgs_end for additional program loops.

FIG. 20C depicts a sequence of Vsgs that may be used in process 2000. The sequence is similar to the one in FIG. 17B. Voltage pulses are not explicitly depicted in FIG. 20C. The bias starts at Vsgs_start at pulse P1. Vsgs decreases by some amount at pulse "n1." Then, Vsgs continues to decrease by some amount until a minimum value for Vsgs is reached. At this point, Vsgs is stabilized at Vsgs_min for additional program loops. Too low Vsgs value may potentially lead to SGS GIDL (gate induced drain leakage) that can result in program disturb on unselected NAND strings. Thus Vsgs_min acts as a protection against SGS GIDL.

Figure 21A:
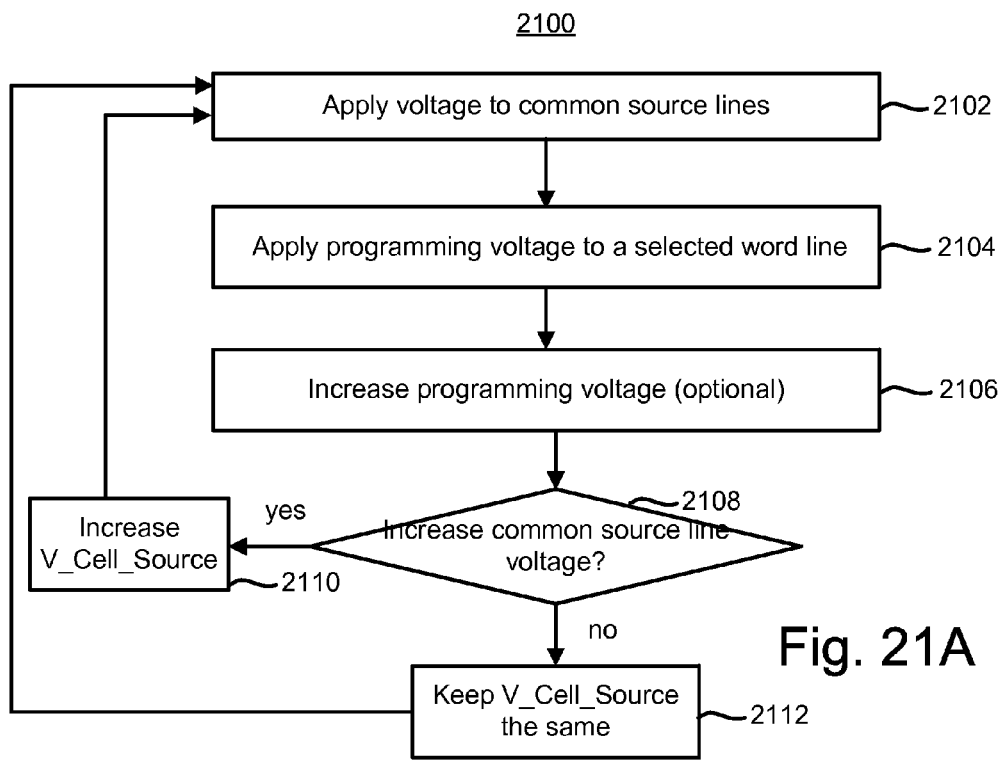
FIG. 21A is a flowchart of one embodiment of a process of increasing the bias applied to the common source line as programming progresses.
Figure 21B:
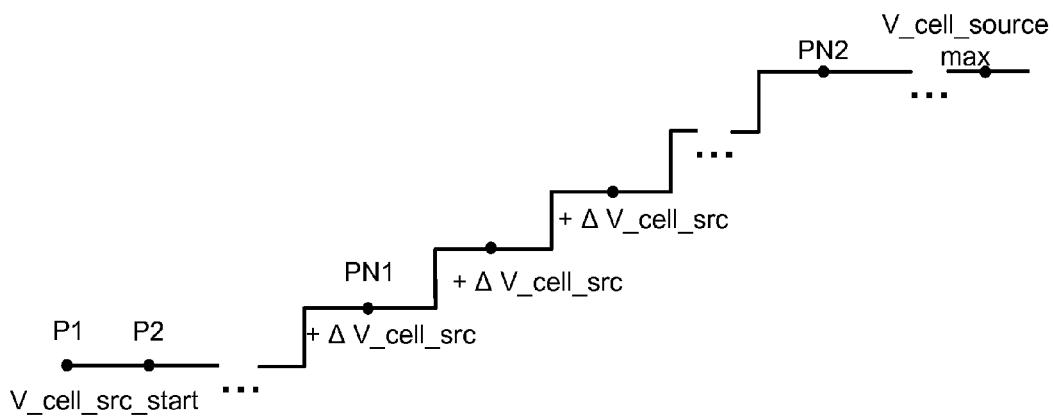
FIG. 21B is an example sequences of V_cell_src that may be applied to the common source line during the process of FIG. 21A.

In one embodiment, decreasing the bias applied to the select transistor includes increasing a voltage applied to a common source line connected to source side select transistors 406. FIG. 21A is a flowchart of one embodiment of a process 2100 of increasing the bias applied to the common source line as programming progresses. FIG. 21B is an example sequences of V_cell_src that may be applied to the common source line during process 2100.

In step 2102, a voltage is applied to a common source line. For example, V_cell_src is applied to the common source line as depicted in the program stage in FIG. 9(H). In one embodiment, this voltage along with a source line voltage (e.g., Vsgs in FIG. 9(A)) causes a Vgs for source side select transistors. As noted, it may be desirable to keep the source side select transistors of all the NAND strings off. Also, as discussed in connection with FIGS. 10A-10C, the source side select transistors of unselected NAND strings may experience side gate effect, which may make it difficult to keep these transistors off. In one embodiment, the value of V_cell_src is increased progressively with higher number of program loops such that the source side select gate transistors of all the NAND strings are kept off. Therefore, program disturb may be prevented or reduced for unselected NAND strings.

In step 2104, a programming voltage is applied to a selected word line. For example, the voltage Vpgm is applied to the selected word line during the program phase depicted in FIG. 9(D). Also note that a boosting voltage such as Vpass may be applied to unselected word lines (FIG. 9(C)), such that the channel potential of unselected word lines may boost.

In step 2106, the programming voltage is optionally increased. In step 2108, a determination is made whether to increase V_cell_src. V_cell_src may be increased in step 2110 or kept the same in step 2112. A process such as the embodiment of FIG. 16A, the embodiment of FIG. 17A or the embodiment of FIG. 17C may be used to make the determination. Then, the process 2100 returns to step 2102.

FIG. 21B depicts a sequence of V_cell_src that may be used in process 2100. Voltage pulses are not explicitly depicted in FIG. 21B. The bias starts at V_cell_src start at pulse P1. V_cell_src increases by some amount at pulse "n1." Then, V_cell_src continues to increase by some amount until pulse "n2" is reached. At this point, V_cell_src is stabilized at V_cell_src_max for additional program loops.

In one embodiment, process 2100 is combined with process 2000 to control the Vgs of source side select transistors. For example, with one program loop, Vsgs might be decreased, whereas with another program loop V_cell_src might be increased. In one program loop Vsgs might be decreased and V_cell_src might be increased.

Figure 22A:
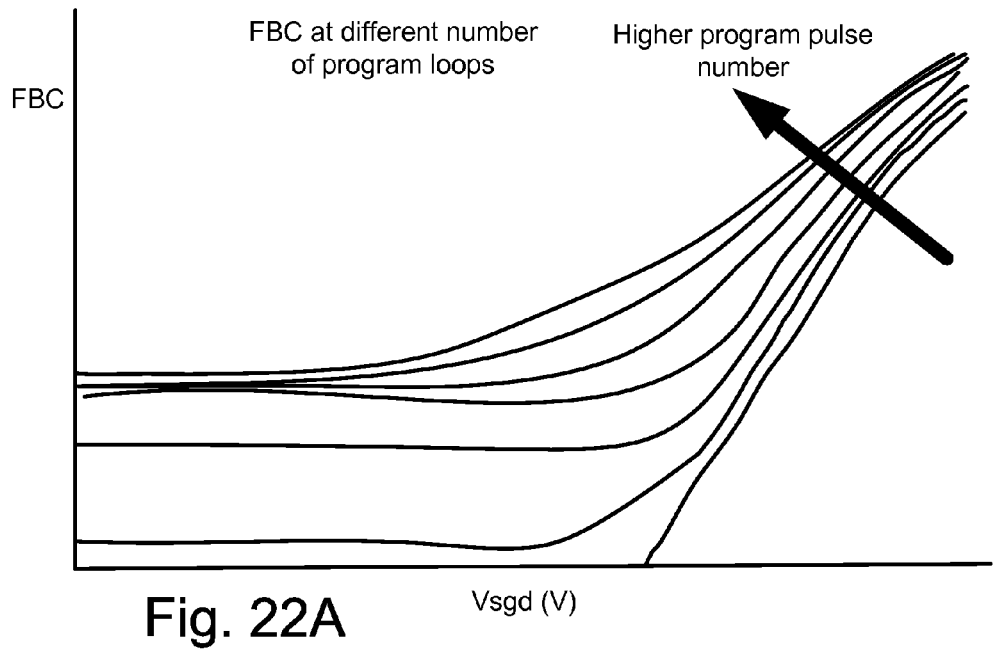
FIG. 22A is a diagram that shows how the fail bit count may be related to the program loop number.

FIG. 22A is a diagram that shows how the fail bit count (FBC) may be related to the program loop number. The curves are for an example in which Vsgd was not adjusted during programming. Each curve corresponds to a maximum number or program loops that was used to program a group of memory cells. Each curve represents fail bit count versus Vsgd for that maximum loop count. The curves show a shift to the left with higher maximum program loop count. This demonstrates that the upper-cliff of Vsgd window shifts to the lower side as the program progresses further to higher program loop count. As described earlier, this behavior may be explained by the lowering of select gate transistor's apparent Vt because of the side gate effect from the inhibited NAND strings.

Figure 22B:
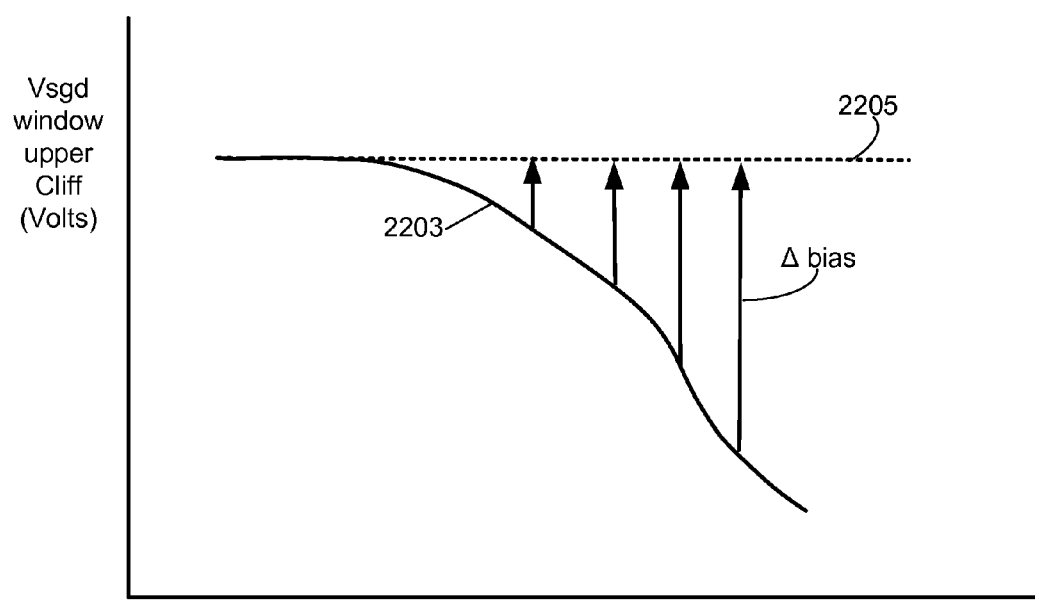
FIG. 22B shows a graph of the upper cliff versus maximum loop count for the example of FIG. 22A.

FIG. 22B shows a graph of the upper cliff versus maximum loop count for the example of FIG. 22A. Curve 2203 shows that the upper cliff may drop (have a lower Vsgd) for higher loop counts. The arrows labeled Δ bias show one possible adjustment that may be made so that the upper cliff maintains the same position throughout programming. In one embodiment, the value of the bit line inhibit voltage is increased during programming to help maintain the upper cliff. In other words, increasing the bit line inhibit voltage with higher number of program loops may prevent the upper cliff from shifting to the left. For example, the inhibit voltage could be increased based on the difference between curve 2203 and the dashed line 2205. Other adjustments can be made as well. For example, the value for Vsgd can be decreased progressively. Also, adjustments may be made to Vsgs and/or to the common source line.

Numerous alternatives to the embodiments and examples disclosed above are contemplated. As in the existing NAND embodiments, an alternative is to fabricate the memory cells from PMOS devices with opposite polarity bias conditions for the various operations as compared to the existing NMOS implementation. In the above examples, the substrate is made of silicon. However, other materials known in the art can also be used such as Gallium Arsenide, etc. It is contemplated that transistors other than field effect transistors (FETs) may be used. If, for example, bipolar junction transistors (BJT) were to be used, then the bias that is decreased during programming may be a base to emitter bias, as one possibility.

One embodiment include a method of operating non-volatile storage that includes a plurality of non-volatile storage elements arranged as NAND strings and a plurality of word lines. Each of the NAND strings has a first select transistor at a first end and a second select transistor at a second end. The method comprises applying a sequence of programming voltages to a selected word line of the plurality of word lines. The selected word line is associated with a group of the non-volatile storage elements. The method further comprises applying a Vgs to the first select transistor of a first of the NAND strings that has a magnitude that is lowered a plurality of times during the sequence of programming voltages. The Vgs is applied to the first select transistor while applying one of the programming voltages.

One method includes a non-volatile storage device comprising a plurality of NAND strings. Each of the NAND strings has a plurality of non-volatile storage elements, a first select transistor at a first end, and a second select transistor at a second end. The non-volatile storage device further comprises a plurality of word lines associated with the plurality of non-volatile storage elements, a first select line associated with the first select transistor of each NAND string, a second select line associated with the second select transistor of each NAND string, and one or more managing circuits in communication with the plurality of bit lines, the plurality of word lines, the first select line, and the second select line. The one or more managing circuits apply a sequence of programming voltages to a selected word line of the plurality of word lines. The one or more managing circuits apply a Vgs to the first select transistor of a first of the NAND strings that has a magnitude that is lowered a plurality of times during the sequence of programming voltages. The one or more managing circuits apply the Vgs to the first select transistor while applying one of the programming voltages.

One embodiment includes a method of operating non-volatile storage that includes a plurality of NAND strings having non-volatile storage elements, a plurality of word lines, and a plurality of bit lines associated with the NAND strings. The method comprises applying a sequence of programming voltages to a selected word line of the plurality of word lines. The selected word line associated with a group of the non-volatile storage elements. The method further comprises applying an inhibit voltage to bit lines of unselected NAND strings that has a magnitude that depends on how far programming of the group of the non-volatile storage elements has progressed. The inhibit voltage is applied while applying one of the programming voltages.

One embodiment includes a non-volatile storage device comprising a plurality of NAND strings. Each of the NAND strings has a plurality of non-volatile storage elements. The non-volatile storage device further comprises a plurality of bit lines associated with the plurality of NAND strings, a plurality of word lines associated with the plurality of non-volatile storage elements, and one or more managing circuits in communication with the plurality of bit lines and the plurality of word lines. The one or more managing circuits apply a sequence of programming voltages to a selected word line of the plurality of word lines. The selected word line associated with a group of the non-volatile storage elements. The one or more managing circuits apply an inhibit voltage to bit lines of unselected NAND strings that has a magnitude that depends on how far programming of the group of the non-volatile storage elements has progressed. The inhibit voltage is applied while applying one of the programming voltages.

One embodiment includes a non-volatile storage device comprising a plurality of NAND strings. Each of the NAND strings has a plurality of non-volatile storage elements, a first side select transistor and a second side select transistor. The first side select transistor has a first terminal, a second terminal, and a third terminal. The second side select transistor has a first terminal, a second terminal, and a third terminal. The non-volatile storage device also has a plurality of bit lines associated with the plurality of NAND strings. Each of the bit lines is coupled to the first terminal of the first side select transistor of one of the NAND strings. The non-volatile storage device also has a common line coupled to the first terminal of the second side select transistor of each of the NAND strings. The non-volatile storage device also has a plurality of word lines associated with the plurality of non-volatile storage elements. The non-volatile storage device also has a first side select line associated with the second terminal of the first side select transistor of each NAND string. The non-volatile storage device also has a second side select line associated with the second terminal of the second side select transistor of each NAND string. The non-volatile storage device also has one or more managing circuits in communication with the plurality of bit lines, the plurality of word lines, the first side select line, and the second side select line. The one or more managing circuits apply a sequence of programming voltages to a selected word line of the plurality of word lines. The one or more managing circuits apply a second terminal to first terminal voltage to either the first side select transistor or the second side select transistor of a first of the NAND strings. The second terminal to first terminal voltage has a magnitude that is progressively lowered during the sequence of programming voltages. The one or more managing circuits apply the second terminal to first terminal voltage to the first side or second side select transistor while applying one of the programming voltages. The one or more managing circuits lower the second terminal to first terminal voltage from one of the programming voltages to the next programming voltage a plurality of times.

One embodiment includes a method of operating non-volatile storage that includes a plurality of non-volatile storage elements arranged as NAND strings. The method comprises accessing a programming status of a first NAND string and a second NAND string that are each adjacent to an unselected NAND string, and applying an inhibit voltage to a bit line associated with the unselected NAND string that depends on the programming status of the first and the second adjacent NAND strings.

One embodiment includes a method of determining a magnitude for inhibit voltage that depends on the programming status of the first and the second adjacent NAND strings. This method may be used with the method of the previous paragraph. This embodiment includes establishing a first magnitude for the bit line voltage for the unselected NAND string if both the first and the second adjacent NAND strings are programming, establishing a second magnitude for the bit line voltage for the unselected NAND string if one but not both of the first and the second adjacent NAND strings are programming, and establishing a third magnitude for the bit line voltage for the unselected NAND string if neither the first nor the second adjacent NAND strings are programming, the third magnitude is higher than the second magnitude, the second magnitude is higher than the first magnitude.

One embodiment includes a non-volatile storage device, comprising a plurality of NAND strings, a plurality of bit lines associated with the plurality of NAND strings, and one or more managing circuits in communication with the plurality of bit lines and the plurality of NAND strings. Each of the NAND strings has a plurality of non-volatile storage elements. The one or more managing circuits access a programming status of a first NAND string and a second NAND string that are each adjacent to an unselected NAND string. The one or more managing circuits apply an inhibit voltage to a bit line associated with the unselected NAND string that depends on the programming status of the first and the second adjacent NAND strings.

One embodiment includes a managing circuit that determines a magnitude for an inhibit voltage that depends on the programming status of first and second adjacent NAND strings. This embodiment may be used with the embodiment of the previous paragraph. The one or more managing circuits establish a first magnitude for the bit line voltage for the unselected NAND string if both the first and the second adjacent NAND strings are programming. The one or more managing circuits establish a second magnitude for the bit line voltage for the unselected NAND string if one but not both of the first and the second adjacent NAND strings are programming. The one or more managing circuits establish a third magnitude for the bit line voltage for the unselected NAND string if neither the first nor the second adjacent NAND strings are programming. The third magnitude is higher than the second magnitude. The second magnitude is higher than the first magnitude.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical application, to thereby enable others skilled in the art to best utilize the various embodiments and with various modifications as are suited to the particular use contemplated. It is intended that the scope be defined by the claims appended hereto.

What is claimed is:

1. A method of operating non-volatile storage that includes a plurality of non-volatile storage elements arranged as NAND strings and a plurality of word lines, each of the NAND strings having a first select transistor at a first end of the NAND string and a second select transistor at a second end of the NAND string, wherein the first select transistor is coupled to a first select line and the second select transistor is coupled to a second select line, wherein each of the NAND strings is associated with a bit line out of a plurality of bit lines and each of the NAND strings is associated with a common source line, the method comprising:

applying a sequence of programming voltages to a selected word line of the plurality of word lines during a programming process having a plurality of program loops, the selected word line associated with a group of the non-volatile storage elements;

locking out non-volatile storage elements that pass programming in a given program loop from being programmed in future program loops of the programming process; and applying a gate-to-source voltage (Vgs) to the first select transistor of a first of the NAND strings while applying each of the programming voltages to the selected word line, including applying a first voltage to the first select line and a second voltage to either the bit line associated with the first NAND string or the common source line associated with the first NAND string while applying the programming voltage for a given program loop to the selected word line, including progressively lowering the maximum magnitude of the difference of the first voltage minus the second voltage from one program loop to the next program loop a plurality of times, wherein the maximum magnitude has a high level, a low level, and at least one intermediate level for different program loops when the first NAND string is not selected for programming.

2. The method of claim 1, wherein the first select transistor is a drain side select transistor coupled to the first select line, the applying a gate-to-source voltage (Vgs) to the first select transistor of a first of the NAND strings includes lowering the first voltage applied to the first select line from one program loop to the next program loop in the programming process a plurality of times.

3. The method of claim 1, wherein the first select transistor is a drain side select transistor coupled to the first select line, wherein the drain side select transistor of each of the NAND strings has a terminal that is coupled to a bit line of the plurality of bit lines, wherein the applying the gate-to-source voltage (Vgs) voltage to the first select transistor of a first of the NAND strings includes:
applying the second voltage to the bit lines associated with unselected NAND strings and raising the second voltage from one program loop to the next program loop in the programming process a plurality of times.

4. The method of claim 1, further comprising:
determining the second voltage to apply to a bit line associated with the first NAND string when it is an unselected NAND string based on programming status of NAND strings neighboring the first NAND string for the present program loop.

5. The method of claim 4, wherein the determining the second voltage to apply to a bit line associated with first NAND string when it is an unselected NAND string based on programming status of NAND strings neighboring the first NAND string includes:
establishing a first magnitude for the second voltage to apply to the bit line associated with the first NAND string when it is an unselected NAND string if both neighbor NAND strings to the unselected NAND string are selected for programming;
establishing a second magnitude for the second voltage to apply to the bit line associated with the first NAND string when it is an unselected NAND string if one but not both neighbor NAND strings to the first NAND string are selected for programming; and
establishing a third magnitude for the second voltage to apply to the bit line associated with the first NAND string when it is an unselected NAND string if neither neighbor NAND strings to the first NAND string are selected for programming, the third magnitude is higher than the second magnitude, the second magnitude is higher than the first magnitude.

6. The method of claim 1, wherein the first select transistor is a source side select transistor associated with the first select line, the applying a gate-to-source voltage (Vgs) to the first select transistor of a first of the NAND strings includes applying the first voltage to the first select line associated with the source side select transistor and lowering the first voltage applied to the first select line from one program loop to the next program loop in the programming process a plurality of times.

7. The method of claim 1, wherein the first select transistor is a source side select transistor associated with the first select line, the source side select transistor of each of the NAND strings has a terminal that is coupled to the common source line, wherein the applying a gate-to-source voltage (Vgs) to the first select transistor of a first of the NAND strings includes:
applying the second voltage to the common source line and raising the second voltage applied to the common source line a plurality of times from one program loop to the next program loop in the programming process.

8. The method of claim 1, wherein the applying a gate-to-source voltage (Vgs) to the first select transistor of a first of the NAND strings includes:
determining a magnitude for the difference of the first voltage minus the second voltage that depends on which program loop of the programming process is being used.

9. The method of claim 1, wherein the applying a gate-to-source voltage (Vgs) to the first select transistor of a first of the NAND strings includes:
determining a magnitude for the difference of the first voltage minus the second voltage that depends on completion of programming of a first state of a plurality of states to which the group of the non-volatile storage elements are being programmed.

10. The method of claim 1, wherein the applying a gate-to-source voltage (Vgs) to the first select transistor of a first of the NAND strings includes:
lowering the magnitude of the difference of the first voltage minus the second voltage from one program loop in the programming process to the next program loop in the programming process two consecutive times.

11. The method of claim 1, further comprising:
applying one or more voltages to selected bit lines associated with the NAND strings, the first select transistor is a drain side select transistor coupled to the first select line, the applying a gate-to-source voltage (Vgs) to the first select transistor of a first of the NAND strings includes:
lowering the magnitude of the first voltage to the first select line from one of the program loops in the programming process to the next program loop in the programming process without lowering the maximum voltage applied to selected bit lines from the one program loop to the next program loop.

12. A non-volatile storage device, comprising:
a plurality of NAND strings, each of the NAND strings having a plurality of non-volatile storage elements, a first select transistor at a first end of the NAND string, and a second select transistor at a second end of the NAND string;
a plurality of bit lines associated with the plurality of NAND strings;
a common source line associated with the plurality of NAND strings;
a plurality of word lines associated with the plurality of non-volatile storage elements;
a first select line coupled to the first select transistor of each NAND string;
a second select line coupled to the second select transistor of each NAND string; and
one or more managing circuits in communication with the plurality of bit lines, the plurality of word lines, the common source line, the first select line, and the second select line, the one or more managing circuits are configured to apply a sequence of programming voltages to a selected word line of the plurality of word lines during a programming process having a plurality of program loops, the one or more managing circuits are configured to determine whether non-volatile storage elements pass programming during a given loop of the programming process and are configured to lock out those non-volatile storage elements that pass from being programmed in future loops of the programming process, the one or more managing circuits are configured to apply a first voltage to the first select line and a second voltage to either the bit line associated with the first select transistor of a first of the NAND strings or the common source line associated with the first NAND string while the programming voltage for a given loop is being applied to the selected word line, wherein the one or more managing circuits are configured to progressively lower the maximum magnitude of the difference of the first voltage minus the second voltage from one program loop to the next program loop a plurality of times, wherein the maximum magnitude of the voltage difference has a high level, a low level, and at least one intermediate level for different program loops when the first NAND string containing the first select transistor is not selected for programming.

13. The non-volatile storage device of claim 12, wherein the first select transistor is a drain side select transistor that is coupled to the first select line, wherein the one or more managing circuits being configured to apply the first voltage to the first select line while the programming voltage for a given loop is being applied to the selected word line comprises the one or more managing circuits being configured to lower the first voltage that is applied to the first select line from one program loop to the next program loop a plurality of times.

14. The non-volatile storage device of claim 12, wherein the first select transistor is a drain side select transistor that is coupled to the first select line, wherein the drain side select transistor of each of the NAND strings has a terminal that is coupled to one of the bit lines, wherein the one or more managing circuits being configured to apply the second voltage to either the bit line associated with the first select transistor or the common source line while the programming voltage for a given loop is being applied to the selected word line includes the one or more managing circuits being configured to apply the second voltage to the bit line associated with unselected NAND strings and to raise the second voltage applied to the bit line associated with unselected NAND strings from one program loop to the next program loop a plurality of times.

15. The non-volatile storage device of claim 12, wherein the one or more managing circuits are configured to determine the second voltage to apply to a first of the bit lines that is associated with the first NAND string when it is unselected for programming based on programming status of NAND strings neighboring the first unselected NAND string.

16. The non-volatile storage device of claim 15, wherein the one or more managing circuits being configured to determine the second voltage to apply to the first bit line associated with the first NAND string when it is unselected based on programming status of NAND strings neighboring the first NAND string comprises:
the one or more managing circuits being configured to establish a first magnitude for the bit line voltage for the first NAND string if both neighbor NAND strings to the first NAND string are selected for programming, the one or more managing circuits being configured to establish a second magnitude for the bit line voltage for the first NAND string if one but not both neighbor NAND strings to the first NAND string are selected for programming, the one or more managing circuits being configured to establish a third magnitude for the bit line voltage for the first NAND string if neither neighbor NAND strings to the first NAND string are selected for programming, the third magnitude is higher than the second magnitude, the second magnitude is higher than the first magnitude.

17. The non-volatile storage device of claim 12, wherein the first select transistor is a source side select transistor that is coupled to the first select line, the one or more managing circuits being configured to apply the first voltage to the first select line while the programming voltage for a given loop is being applied to the selected word line includes the one or more managing circuits being configured to lower the first voltage that is applied to the first select line from one program loop to the next program loop a plurality of times.

18. The non-volatile storage device of claim 12, wherein the first select transistor is a source side select transistor that is coupled to the first select line, wherein source side select transistor of each of the NAND strings has a terminal that is coupled to a common source line, wherein the one or more managing circuits being configured to apply the second voltage to either the bit line associated with the first select transistor or the common source line while the programming voltage for a given loop is being applied to the selected word line includes the one or more managing circuits being configured to apply the second voltage to the common source line and to raise the second voltage applied to the common source line a plurality of times from one program loop to the next program loop in the sequence.

19. The non-volatile storage device of claim 12, wherein the one or more managing circuits being configured to apply the first voltage to the first select line and a second voltage to either the bit line associated with the first select transistor or the common source line while the programming voltage for a given loop is being applied to the selected word line includes the one or more managing circuits being configured to determine a magnitude for the difference of the first voltage minus the second voltage that depends on which programming voltage in the sequence is being applied.

20. A method of operating non-volatile storage that includes a plurality of NAND strings having non-volatile storage elements, a plurality of word lines, and a plurality of bit lines associated with the NAND strings, each of the NAND strings having a first select transistor on a first end of the NAND string and a second select transistor on a second end of the NAND string, wherein the first select transistor of a first of the NAND strings is connected to a first select line and the second select transistor of the first NAND string is connected to a second select line, the method comprising:
applying a programming voltage to a selected word line of the plurality of word lines during each of a number of program loops, the selected word line associated with a group of the non-volatile storage elements; and
applying a first voltage to the first select line and a second voltage to either the bit line associated with the first NAND string or a common source line associated with the first NAND string while the programming voltage for a given loop is being applied to the selected word line, wherein a maximum magnitude of the difference of the first voltage minus the second voltage is progressively lowered as programming of the group of the non-volatile storage elements progresses from one program loop to the next program loop, wherein the maximum magnitude has a high level, a low level, and at least one intermediate level for different program loops when the first NAND string is not selected for programming.

21. The method of claim 20, wherein the applying a first voltage to the first select line and a second voltage to either the bit line associated with the first NAND string or the common source line while the programming voltage for a given loop is being applied to the selected word line comprises:

applying an inhibit voltage to bit lines of unselected NAND strings that has a magnitude that depends on how far programming of the group of the non-volatile storage elements has progressed, the inhibit voltage is applied while applying one of the programming voltages.

22. The method of claim 21, wherein the applying an inhibit voltage to bit lines of unselected NAND strings includes:

increasing the magnitude of the inhibit voltage applied to bit lines of unselected NAND strings from the programming voltage in one of the program loops to the programming voltage in the next program loop.

23. The method of claim 22, wherein the increasing the magnitude of the inhibit voltage applied to bit lines of unselected NAND strings includes:

determining a magnitude for the inhibit voltage that depends on which program loop voltage in which the programming voltage is being applied to the selected word line.

24. The method of claim 21, wherein the applying an inhibit voltage to bit lines of unselected NAND strings includes:

increasing the magnitude of the inhibit voltage for at least two consecutive program loops.

25. The method of claim 21, wherein the applying an inhibit voltage to bit lines of unselected NAND strings includes:

determining a magnitude for the inhibit voltage that depends on completion of programming of a first state of a plurality of states to which the group of the non-volatile storage elements are being programmed.

26. The method of claim 1, wherein the plurality of non-volatile storage elements arranged as NAND strings are part of a three-dimensional memory array.

27. A non-volatile storage device, comprising:

a three-dimensional memory array comprising: a plurality of NAND strings, a plurality of bit lines associated with the plurality of NAND strings, a common source line associated with the plurality of NAND strings, and a plurality of word lines associated with the plurality of NAND strings, each of the NAND strings having a plurality of non-volatile storage elements, a first select transistor at a first end of each NAND string, and a second select transistor at a second end of each NAND string, wherein the three-dimensional memory array further comprises a first select line coupled to the first select transistor of a first of the NAND strings and a second select line coupled to the second select transistor of the first NAND string; and one or more managing circuits in communication with the plurality of bit lines, the common source line, the first select line, the second select line, and the plurality of word lines, the one or more managing circuits perform a programming process comprising a plurality of program loops, the one or more managing circuits perform a programming loop in the programming process in which the one or more managing circuits apply a programming voltage to a selected word line of the plurality of word lines, apply a first voltage to the first select line and a second voltage to either the bit line associated with the first NAND string or the common source line associated with the first NAND string while the programming voltage for a given loop is being applied to the selected word line verify whether selected non-volatile storage elements associated with the selected word line are programmed after applying the programming voltage, and lock out non-volatile storage elements that are programmed, the one or more managing circuits reduce the maximum magnitude of the difference of the first voltage minus the second voltage to the first select transistor from one program loop to the next a plurality of times during the programming process, the maximum magnitude of the difference of the first voltage minus the second voltage to the first select transistor is progressively lowered as the programming process progresses, wherein the maximum magnitude of the voltage difference has a high level, a low level, and at least one intermediate level for different program loops when the first NAND string containing the first select transistor is not selected for programming.

* * * * *